US011096000B2

(12) United States Patent
Oh et al.

(10) Patent No.: US 11,096,000 B2
(45) Date of Patent: Aug. 17, 2021

(54) METHOD AND APPARATUS FOR PROCESSING MULTIMEDIA SIGNALS

(71) Applicant: WILUS INSTITUTE OF STANDARDS AND TECHNOLOGY INC., Seongnam-si (KR)

(72) Inventors: Hyunoh Oh, Seongnam-si (KR); Taegyu Lee, Seongnam-si (KR)

(73) Assignees: WILUS INSTITUTE OF STANDARDS AND TECHNOLOGY INC., Seongnam-si (KR); GCOA CO., LTD., Seoul (KR)

(*) Notice: Subject to any disclaimer, the term of this patent is extended or adjusted under 35 U.S.C. 154(b) by 0 days.

(21) Appl. No.: 16/581,782

(22) Filed: Sep. 25, 2019

(65) Prior Publication Data

US 2020/0021936 A1  Jan. 16, 2020

Related U.S. Application Data

(63) Continuation of application No. 15/022,923, filed as application No. PCT/KR2014/008679 on Sep. 17, 2014, now Pat. No. 10,469,969.
(Continued)

(30) Foreign Application Priority Data

Oct. 22, 2013  (KR) .................. 10-2013-0125936

(51) Int. Cl.
*H04S 5/00* (2006.01)
*H04S 3/00* (2006.01)
(Continued)

(52) U.S. Cl.
CPC ............ *H04S 5/005* (2013.01); *G10L 19/008* (2013.01); *G10L 19/0204* (2013.01);
(Continued)

(58) Field of Classification Search
CPC ............. H04S 2420/01; H04S 2420/03; H04S 2420/07; H04S 2420/11; G10L 19/008
See application file for complete search history.

(56) References Cited

U.S. PATENT DOCUMENTS

| 5,329,587 A | 7/1994 | Morgan et al. |
| 5,371,799 A | 12/1994 | Lowe et al. |

(Continued)

FOREIGN PATENT DOCUMENTS

| EP | 2541542 A1 | 1/2013 |
| EP | 2840811 A1 | 2/2015 |

(Continued)

OTHER PUBLICATIONS

International Search Report in International Application No. PCT/KR2014/008679, dated Jan. 26, 2015.
(Continued)

*Primary Examiner* — Kile O Blair
(74) *Attorney, Agent, or Firm* — Park, Kim & Suh, LLC

(57) ABSTRACT

The present invention relates to a method and an apparatus for processing a signal, which are used for effectively reproducing a multimedia signal, and more particularly, to a method and an apparatus for processing a signal, which are used for implementing filtering for multimedia signal having a plurality of subbands with a low calculation amount.
To this end, provided are a method for processing a multimedia signal including: receiving a multimedia signal having a plurality of subbands; receiving at least one proto-type filter coefficients for filtering each subband signal of the multimedia signal; converting the proto-type filter coefficients into a plurality of subband filter coefficients; truncating each subband filter coefficients based on filter order information obtained by at least partially using characteristic information extracted from the corresponding subband filter coefficients, the length of at least one truncated subband
(Continued)

filter coefficients being different from the length of truncated subband filter coefficients of another subband; and filtering the multimedia signal by using the truncated subband filter coefficients corresponding to each subband signal and an apparatus for processing a multimedia signal using the same.

10 Claims, 16 Drawing Sheets

Related U.S. Application Data

(60) Provisional application No. 61/878,638, filed on Sep. 17, 2013, provisional application No. 61/894,442, filed on Oct. 23, 2013.

(51) Int. Cl.
| | |
|---|---|
| *H03H 17/02* | (2006.01) |
| *G10L 19/02* | (2013.01) |
| *G10L 25/48* | (2013.01) |
| *G10L 19/008* | (2013.01) |
| *H04R 5/04* | (2006.01) |
| *H04S 7/00* | (2006.01) |
| *H03H 21/00* | (2006.01) |
| *H04S 3/02* | (2006.01) |

(52) U.S. Cl.
CPC ......... *G10L 25/48* (2013.01); *H03H 17/0229* (2013.01); *H03H 17/0248* (2013.01); *H03H 17/0266* (2013.01); *H03H 17/0272* (2013.01); *H03H 21/0012* (2013.01); *H04R 5/04* (2013.01); *H04S 3/00* (2013.01); *H04S 3/002* (2013.01); *H04S 3/008* (2013.01); *H04S 3/02* (2013.01); *H04S 7/30* (2013.01); *H04S 2400/01* (2013.01); *H04S 2400/03* (2013.01); *H04S 2420/03* (2013.01); *H04S 2420/07* (2013.01); *H04S 2420/11* (2013.01)

(56) References Cited

U.S. PATENT DOCUMENTS

| | | | |
|---|---|---|---|
| 5,544,249 A | 8/1996 | Opitz | |
| 5,757,931 A | 5/1998 | Yamada et al. | |
| 6,108,626 A | 8/2000 | Cellario et al. | |
| 7,715,575 B1 | 5/2010 | Villemoes et al. | |
| 8,255,212 B2 * | 8/2012 | Villemoes | H03H 17/0272 704/229 |
| 8,265,284 B2 | 9/2012 | Villemoes et al. | |
| 8,515,104 B2 | 8/2013 | Dickins et al. | |
| 8,788,554 B2 | 7/2014 | Christoph | |
| 9,319,794 B2 | 4/2016 | Betlehem et al. | |
| 9,432,790 B2 | 8/2016 | Raghuvanshi et al. | |
| 9,578,437 B2 | 2/2017 | Oh et al. | |
| 9,832,585 B2 | 11/2017 | Oh et al. | |
| 2005/0117762 A1 | 6/2005 | Sakurai et al. | |
| 2007/0071249 A1 | 3/2007 | Reining | |
| 2007/0100612 A1 | 5/2007 | Ekstrand et al. | |
| 2007/0172086 A1 | 7/2007 | Dickins et al. | |
| 2008/0008342 A1 | 1/2008 | Sauk | |
| 2008/0025519 A1 | 1/2008 | Yu et al. | |
| 2008/0033730 A1 | 2/2008 | Jot et al. | |
| 2008/0192941 A1 | 8/2008 | Oh et al. | |
| 2008/0205658 A1 | 8/2008 | Breebaart | |
| 2008/0253578 A1 | 10/2008 | Breebaart et al. | |
| 2009/0012638 A1 | 1/2009 | Lou | |
| 2009/0041263 A1 | 2/2009 | Hoshuyama | |
| 2009/0043591 A1 | 2/2009 | Breebaart et al. | |
| 2009/0103738 A1 | 4/2009 | Faure et al. | |
| 2009/0252356 A1 | 10/2009 | Goodwin et al. | |
| 2009/0319283 A1 | 12/2009 | Schnell et al. | |
| 2010/0017195 A1 | 1/2010 | Villemoes | |
| 2010/0080112 A1 | 4/2010 | Bertrand et al. | |
| 2010/0169104 A1 | 7/2010 | Ekstrand et al. | |
| 2010/0246832 A1 | 9/2010 | Villemoes et al. | |
| 2010/0246851 A1 | 9/2010 | Buck et al. | |
| 2010/0322431 A1 | 12/2010 | Lokki et al. | |
| 2011/0170721 A1 | 7/2011 | Dickins et al. | |
| 2011/0211702 A1 | 9/2011 | Mundt et al. | |
| 2011/0261948 A1 | 10/2011 | Deng et al. | |
| 2011/0264456 A1 | 10/2011 | Koppens et al. | |
| 2011/0305345 A1 | 12/2011 | Bouchard et al. | |
| 2012/0014528 A1 | 1/2012 | Wang | |
| 2012/0039477 A1 | 2/2012 | Schijers et al. | |
| 2012/0243713 A1 | 9/2012 | Hess et al. | |
| 2013/0028427 A1 | 1/2013 | Yamamoto et al. | |
| 2013/0090933 A1 | 4/2013 | Villemoes et al. | |
| 2013/0182870 A1 | 7/2013 | Villemoes et al. | |
| 2013/0208902 A1 | 8/2013 | Yamamoto et al. | |
| 2013/0272526 A1 | 10/2013 | Walther | |
| 2013/0272527 A1 | 10/2013 | Oomen et al. | |
| 2014/0006037 A1 | 1/2014 | Honma et al. | |
| 2014/0088978 A1 | 3/2014 | Mundt et al. | |
| 2014/0270189 A1 | 9/2014 | Atkins et al. | |
| 2014/0355796 A1 | 12/2014 | Xiang et al. | |
| 2015/0030160 A1 | 1/2015 | Lee et al. | |
| 2015/0223002 A1 | 8/2015 | Mehta et al. | |
| 2016/0189723 A1 | 6/2016 | Davis | |
| 2016/0198281 A1 | 7/2016 | Oh et al. | |
| 2016/0249149 A1 | 8/2016 | Oh et al. | |
| 2016/0275956 A1 | 9/2016 | Lee et al. | |

FOREIGN PATENT DOCUMENTS

| | | | |
|---|---|---|---|
| JP | 2009-531906 | A | 9/2009 |
| JP | 2009-261022 | A | 11/2009 |
| JP | 5084264 | B2 | 11/2012 |
| KR | 10-2005-0123396 | A | 12/2005 |
| KR | 10-0754220 | B1 | 9/2007 |
| KR | 10-2008-0076691 | A | 8/2008 |
| KR | 10-2008-0078882 | A | 8/2008 |
| KR | 10-2008-0098307 | A | 11/2008 |
| KR | 10-2008-0107422 | A | 12/2008 |
| KR | 10-2009-0020813 | A | 2/2009 |
| KR | 10-2009-0047341 | A | 5/2009 |
| KR | 10-0924576 | B1 | 11/2009 |
| KR | 10-2010-0062784 | A | 6/2010 |
| KR | 10-2010-0063113 | A | 6/2010 |
| KR | 10-0971700 | B1 | 7/2010 |
| KR | 10-2011-0002491 | A | 1/2011 |
| KR | 10-2012-0006060 | A | 1/2012 |
| KR | 10-2012-0013893 | A | 2/2012 |
| KR | 10-1146841 | B1 | 5/2012 |
| KR | 10-2013-0045414 | A | 5/2013 |
| KR | 10-2013-0081290 | A | 7/2013 |
| KR | 10-1304797 | B1 | 9/2013 |
| KR | 10-1833059 | B1 | 2/2018 |
| WO | 20081003467 | A1 | 1/2008 |
| WO | 2009/046223 | A2 | 4/2009 |
| WO | 2011-115430 | A2 | 9/2011 |
| WO | 2012/023864 | A1 | 2/2012 |
| WO | 2015/041476 | A1 | 3/2015 |

OTHER PUBLICATIONS

Jeroen Breebaart et al., 'Binaural Rendering in MPEG Surround', EURASIP Journal on advances in signal processing, Jan. 2, 2008, vol. 2008, No. 7, p. 1-14.

Astik Biswas et al., 'Admissible wavelet packet features based on human inner ear frequency response for Hindi consonant recognition' Computers & Electrical Engineering, Feb. 22, 2014, p. 1111-1122.

International Search Report and Written Opinion of the International Searching Authority dated Jan. 23, 2015 for Application No. PCT/KR2014/008678.

International Search Report and Written Opinion of the International Searching Authority dated Jan. 26, 2015 for Application No. PCT/KR2014/009975.

(56) References Cited

OTHER PUBLICATIONS

International Search Report and Written Opinion of the International Searching Authority dated Jan. 20, 2015 for Application No. PCT/KR2014/009978.
International Search Report and Written Opinion of the International Searching Authority dated Apr. 13, 2015 for Application No. PCT/KR2014/012758.
International Search Report and Written Opinion of the International Searching Authority dated Apr. 13, 2015 for Application No. PCT/KR2014/012764.
International Search Report and Written Opinion of the International Searching Authority dated Jun. 5, 2015 for Application No. PCT/KR2015/002669.
International Search Report and Written Opinion of the International Searching Authority dated Jun. 22, 2015 for Application No. PCT/KR2015/003328.
International Search Report and Written Opinion of the International Searching Authority dated Jun. 5, 2015 for Application No. PCT/KR2015/003330.
Korean Office Action in Application No. 10-2016-7001 431 dated Apr. 6, 2016 with English translation.
International Search Report and Written Opinion of the International Searching Authority dated Jan. 23, 2015 for Application No. PCT/KR2014/008677.
International Search Report and Written Opinion of the International Searching Authority dated Jan. 26, 2015 for Application No. PCT/KR2014/008679.
International Search Report and Written Opinion of the International Searching Authority dated Apr. 13, 2015 for Application No. PCT/KR2014/012766.
Korean Office Action in Application No. 10-2016-7001432 dated Apr. 12, 2016 with English translation.
U.S. Office Action in U.S. Appl. No. 15/145,822 dated Jun. 13, 2016.
U.S. Office Action in U.S. Appl. No. 14/990,814 dated Jun. 13, 2016.
Korean Office Action in Appln. No. 10-2016-7006858 dated Mar. 20, 2017 with English Translation.
Korean Office Action in Appln. No. 10-2016-7006859 dated Mar. 20, 2017 with English Translation.
Korean Office Action in Appln. No. 10-2016-7009852 dated Mar. 20, 2017 with English Translation.
Korean Office Action in Appln. No. 10-2016-7009853 dated Mar. 20, 2017 with English Translation.
European Search Report in Appln. No. 14846160.1 dated Apr. 28, 2017.
European Search Report in Appln. No. 14845972.0 dated Apr. 28, 2017.
European Search Report in Appln. No. 14846500.8 dated Apr. 28, 2017.
Emerit Marc et al: "Efficient Binaural Filtering in QMF Domain for BRIR", AES Convention 122; May 2007, AES, 60 East 42nd Street, Room 2520 New York 10165-2520, USA, May 1, 2007 (May 1, 2007), XP040508167, *the whole document*.
U.S. Office Action in U.S. Appl. No. 15/107,462 dated Mar. 16, 2017.
U.S. Office Action in U.S. Appl. No. 15/022,922 dated Feb. 21, 2017.
Smith, Julious Orion. "Physical Audio Signal Processing: for virtual musical instruments and audio effects." pp. 1-3. 2006.
"Information technology—MPEG audio technologies—part1:MPEG Surround",ISO/IEC 23003-1:2007, IEC,3,Rue De Varembe, PO Box 131, CH-1211 Geneva 20, Switzerland, Jan. 29, 2007(Jan. 29, 2007), pp. 1-280, XP082000863.

David Virette et al: "Description of France Telecom Binaural Decoding proposal for MPEG Surround", 76. MPEG Meeting, Mar. 4, 2006-Jul. 4, 2006; Montreux; (Motion Picture Expert Group or ISO/IEC JTC1/SC29/WG11)No. M13276, Mar. 30, 2006, XP030041945, ISSN: 0000-0239.
Torres J C B et al : "Low-order modeling of head-related transfer functions using wavelet transforms", Proceedings / 2004 IEEE International Symposium on Circuits and Systems : May 23-26, 2004, Sheraton Vancouver Wall Centre Hotel, Vancouver, British Columbia, Canada, IEEE Operations Center, Piscataway, NJ, May 23, 2004, pp. III-513, XP010719328, ISBN: 978-0-7803-8251-0.
ISO/IEC FDIS 23003-1:2006(E). Information technology—MPEG audio technologies Part 1: MPEG Surround. ISO/IEC JTC 1/SC 29/WG 11. Jul. 21, 2006.
European Search Report in Appln. No. 14 856 742.3 dated Jun. 1, 2017.
European Search Report in Appln. No. 14 855 415.7 dated Jun. 1, 2017.
European Search Report in Appln. No. 14 875 534.1 dated Jul. 27, 2017.
Korean Office Action in Appln. No. 10-2016-7016590 dated Jun. 5, 2017 with English translation.
U.S. Final Office Action in U.S. Appl. No. 15/022,922 dated Aug. 23, 2017.
European Search Report in Appln. No. 15764805.6 dated Sep. 15, 2017.
U.S. Notice of Allowance in U.S. Appl. No. 15/300,277 dated Aug. 28, 2017.
Chinese Notice of Allowance in Appln. No. 201580018973.0 dated May 9, 2018.
Canadian Office Action in Appln. No. 2934856 dated Jun. 15, 2018.
U.S. Office Action in U.S. Appl. No. 15/031,275 dated Apr. 5, 2018.
U.S. Notice of Allowance in U.S. Appl. No. 15/795,180 dated May 3, 2018.
U.S. Office Acton in U.S. Appl. No. 15/031,274 dated May 7, 2018.
Canadian Office Action in Appln. No. 2924458 dated Jan. 16, 2019, 5 pages.
European Office Action in Appln. No. 14855415.7 dated Feb. 7, 2019, 5 pages.
European Notice of Allowance in Appln. No. 14856742.3 dated Feb. 8, 2019, 8 pages.
U.S. Office Action in U.S. Appl. No. 15/942,588 dated Jan. 24, 2019, 36 pages.
Smith, Julius O. Introduction to Digital Filters: With Audio Applications. W3K, 2008. pp. 97-100.
Wikipedia, Finite impulse response, Retrieved from 'http://en.wikipedia.org/w/index.php?title=Finite_impulse_response&oldid=796713970', last edited on Aug. 22, 2017, 6pages.
European Office Action in Appln. No. 15764805.6 dated Feb. 18, 2020, 9pages.
Jeongil Seo et al., 'Technical Description of ETRI/Yonsei/WILUS Binaural CE proposal in MPEG-H 3D Audio', ISO/IEC JTC1/SC29/WG11 MPEG2014/M32223, Jan. 2014, San Jose, USA, 8pages.
Marc Emerit et al., 'Thoughts on binaural parameterization of MPEG codecs', ISO/ICE JTC1/SC29/WG11 MPEG2013/M31427, Oct. 2013, Geneva, Switzerland, 25pages.
Brazilian Search Report in Appln. No. 112016005956-5 dated Mar. 9, 2020, 7pages with English Translation.
Brazilian Search Report in Appln. No. 112016014892-4 dated Mar. 31, 2020, 7pages with English Translation.
U.S. Notice of Allowance in U.S. Appl. No. 16/395,242 dated May 6, 2020, 12pages.
Korean Notice of Allowance in Appln. No. 10-2018-7005180 dated Jun. 9, 2020, 4pages with English Translation.
European Search Report in Appln. No. 20203224.9 dated Mar. 15, 2021, 7pages.

* cited by examiner

METHOD AND APPARATUS FOR PROCESSING MULTIMEDIA SIGNALS

CROSS-REFERENCE TO RELATED APPLICATIONS

This application is a continuation of U.S. patent application Ser. No. 15/022,923, filed on Mar. 17, 2016, which is the National Stage filing under 35 U.S.C. 371 of International Application No. PCT/KR2014/008679, filed on Sep. 17, 2014, which claims the benefit of U.S. Provisional Patent Application No. 61/878,638, filed on Sep. 17, 2013, Korean Patent Application No. 10-2013-0125936, filed on Oct. 22, 2013, and U.S. Provisional Patent Application No. 61/894,442, filed on Oct. 23, 2013, the contents of which are all hereby incorporated by reference herein in their entirety.

TECHNICAL FIELD

The present invention relates to a method and an apparatus for processing a signal, which are used for effectively reproducing a multimedia signal, and more particularly, to a method and an apparatus for processing a signal, which are used for implementing filtering for multimedia signal having a plurality of subbands with a low calculation amount.

BACKGROUND ART

There is a problem in that binaural rendering for hearing multi-channel signals in stereo requires a high computational complexity as the length of a target filter increases. In particular, when a binaural room impulse response (BRIR) filter reflected with characteristics of a recording room is used, the length of the BRIR filter may reach 48,000 to 96,000 samples. Herein, when the number of input channels increases like a 22.2 channel format, the computational complexity is enormous.

When an input signal of an i-th channel is represented by $x_i(n)$, left and right BRIR filters of the corresponding channel are represented by $b_i^L(n)$ and $b_i^R(n)$ respectively, and output signals are represented by $y^L(n)$ and $y^R(n)$, binaural filtering can be expressed by an equation given below.

$$y^m(n) = \sum_i x_i(n) * b_i^m(n), \quad \text{[Equation 1]}$$

where $m \in \{L, R\}$

Herein, * represents a convolution. The above time-domain convolution is generally performed by using a fast convolution based on Fast Fourier transform (FFT). When the binaural rendering is performed by using the fast convolution, the FFT needs to be performed by the number of times corresponding to the number of input channels, and inverse FFT needs to be performed by the number of times corresponding to the number of output channels. Moreover, since a delay needs to be considered under a real-time reproduction environment like multi-channel audio codec, block-wise fast convolution needs to be performed, and more computational complexity may be consumed than a case in which the fast convolution is just performed with respect to a total length.

However, most coding schemes are achieved in a frequency domain, and in some coding schemes (e.g., HE-AAC, USAC, and the like), a last step of a decoding process is performed in a QMF domain. Accordingly, when the binaural filtering is performed in the time domain as shown in Equation 1 given above, an operation for QMF synthesis is additionally required as many as the number of channels, which is very inefficient. Therefore, it is advantageous that the binaural rendering is directly performed in the QMF domain.

DISCLOSURE

Technical Problem

The present invention has an object, with regard to reproduce multi-channel or multi-object signals in stereo, to implement filtering process, which requires a high computational complexity, of binaural rendering for reserving immersive perception of original signals with very low complexity while minimizing the loss of sound quality.

Furthermore, the present invention has an object to minimize the spread of distortion by using high-quality filter when a distortion is contained in the input signal.

Furthermore, the present invention has an object to implement finite impulse response (FIR) filter which has a long length with a filter which has a shorter length.

Furthermore, the present invention has an object to minimize distortions of portions destructed by discarded filter coefficients, when performing the filtering by using truncated FIR filter.

Technical Solution

In order to achieve the objects, the present invention provides a method and an apparatus for processing an audio signal as below.

An exemplary embodiment of the present invention provides a method for processing an audio signal including: receiving multi-audio signals including multi-channel or multi-object signals; receiving truncated subband filter coefficients for filtering the multi-audio signals, the truncated subband filter coefficients being at least a portion of subband filter coefficients obtained from binaural room impulse response (BRIR) filter coefficients for binaural filtering of the multi-audio signals, the lengths of the truncated subband filter coefficients being determined based on filter order information obtained by at least partially using characteristic information extracted from the corresponding subband filter coefficients, and the length of at least one truncated subband filter coefficients being different from the length of truncated subband filter coefficients of another subband; and filtering the subband signal by using the truncated subband filter coefficients corresponding to each subband signal of the multi-audio signals.

Another exemplary embodiment of the present invention provides an apparatus for processing an audio signal, which is used for performing binaural rendering for multi-audio signals including multi-channel or multi-object signals, the multi-audio signals each including a plurality of subband signals, including: a fast convolution unit configured to perform rendering of direct sound and early reflections sound parts for each subband signal; and a late reverberation generation unit configured to perform rendering of a late reverberation part for each subband signal, wherein the fast convolution unit receives truncated subband filter coefficients for filtering the multi-audio signals, the truncated subband filter coefficients being at least a part of subband filter coefficients obtained from binaural room impulse response (BRIR) filter coefficients for binaural filtering of the multi-audio signals, the lengths of the truncated subband filter coefficients being determined based on filter order information obtained by at least partially using characteristic information extracted from the corresponding subband filter coefficients, and the length of at least one truncated subband filter coefficients being different from the length of truncated subband filter coefficients of another subband, and filters the subband signal by using the truncated subband filter coefficients corresponding to each subband signal of the multi-audio signals.

The characteristic information may include first reverberation time information of the corresponding subband filter coefficients, and the filter order information may have one value for each subband.

The length of the truncated subband filter may have a value of a multiple of the power of 2.

The plurality of subband filter coefficients and a plurality of subband signals may include a first subband group having low frequencies and a second subband group having high frequencies based on a predetermined frequency band, respectively, and the filtering is performed with respect to the truncated subband filter coefficients and the subband signals of the first subband group.

The filtering is performed by using front subband filter coefficients truncated based at least in part on the first reverberation time information of the corresponding subband filter coefficients, and the method may further include processing reverberation of the subband signal corresponding to a zone which follows the front subband filter coefficients among the subband filter coefficients.

The processing of the reverberation may include: receiving downmix subband filter coefficients for each subband, the downmix subband filter coefficients being generated by combining respective rear subband filter coefficients for each channel or each object of the corresponding subband, and the rear subband filter coefficients being obtained from the zone which follows the front subband filter coefficients among the corresponding subband filter coefficients; generating the downmix subband signal for each subband, the downmix subband signal being generated by downmixing the respective subband signals for each channel of each object of the corresponding subband; and generating 2-channel left and right subband reverberation signals by using the downmix subband signal and the downmix subband filter coefficients corresponding thereto.

The method may further include, wherein the downmix subband signal is a mono subband signal, and the downmix subband filter coefficients reflect an energy decay characteristic of a reverberation part for the corresponding subband signal, generating a decorrelation signal for the filtered mono subband signal; and generating 2-channel left and right signals by performing weighted summing between the filtered mono subband signal and the decorrelation signal.

Yet another exemplary embodiment of the present invention provides a method for processing an audio signal, including: receiving multi-audio signals including multi-channel or multi-object signals, each of the multi-audio signals including a plurality of subband signals, and the plurality of subband signals including a signal of a first subband group having low frequencies and a signal of a second subband group having high frequencies based on a predetermined frequency band; receiving at least one parameter corresponding to each subband signal of the second subband group, the at least one parameter being extracted from binaural room impulse response (BRIR) subband filter coefficients corresponding to each subband signal of the second subband group; and performing tap-delay line filtering of the subband signal of the second subband group by using the received parameter.

Still another exemplary embodiment of the present invention provides an apparatus for processing an audio signal, which is used for performing binaural rendering for multi-audio signals including multi-channel or multi-object signals, each of the multi-audio signals including a plurality of subband signals, and the plurality of subband signals including a signal of a first subband group having low frequencies and a signal of a second subband group having high frequencies based on a predetermined frequency band, including: a fast convolution unit configured to perform rendering of each subband signal of the first subband group; and a tap-delay line processing unit configured to perform rendering of each subband signal of the second subband group, wherein the tap-delay line processing unit receives at least one parameter corresponding to each subband signal of the second subband group, the at least one parameter being extracted from binaural room impulse response (BRIR) subband filter coefficients corresponding to each subband signal of the second subband group, and performs tap-delay line filtering of the subband signal of the second subband group by using the received parameter.

The parameter may include one delay information for the corresponding BRIR subband filter coefficients and one gain information corresponding to the delay information.

The tap-delay line filtering may be one-tap-delay line filtering using the parameter.

The delay information may indicate positional information for a maximum peak in the BRIR subband filter coefficients.

The delay information may have a sample based integer value in a QMF domain.

The gain information may have a complex value.

The method may further include: summing the filtered multi-audio signals to 2-channel left and right subband signals for each subband; coupling the summed left and right subband signals with left and right subband signals generated from the multi-audio signals of the first subband group; and QMF-synthesizing the respective coupled left and right subband signals.

Still yet another exemplary embodiment of the present invention provides a method for processing a multimedia signal, including: receiving a multimedia signal having a plurality of subbands; receiving at least one proto-type filter coefficients for filtering each subband signal of the multimedia signal; converting the proto-type filter coefficients into a plurality of subband filter coefficients; truncating each subband filter coefficients based on filter order information obtained by at least partially using characteristic information extracted from the corresponding subband filter coefficients, the length of at least one truncated subband filter coefficients being different from the length of truncated subband filter coefficients of another subband; and filtering the multimedia signal by using the truncated subband filter coefficients corresponding to each subband signal.

Still yet another exemplary embodiment of the present invention provides an apparatus for processing a multimedia signal having a plurality of subbands, including: a parameterization unit configured to receive at least one proto-type filter coefficients for filtering each subband signal of the multimedia signal, convert the proto-type filter coefficients into a plurality of subband filter coefficients, and truncate each subband filter coefficients based on filter order information obtained by at least partially using characteristic information extracted from the corresponding subband filter coefficients, the length of at least one truncated subband filter coefficients being different from the length of truncated subband filter coefficients of another subband; and a rendering unit configured to receive the multimedia signal and filter the multimedia signal by using the truncated subband filter coefficients corresponding to each subband signal.

The multimedia signal may include multi-channel or multi-object signals, and the proto-type filter coefficients may be BRIR filter coefficients of a time domain.

The characteristic information may include energy decay time information of the corresponding subband filter coefficients, and the filter order information may have one value for each subband.

Still yet another exemplary embodiment of the present invention provides a method for processing an audio signal, including: receiving multi-audio signals including multi-channel or multi-object signals, each of the multi-audio signals including a plurality of subband signals and the plurality of subband signals including signals of a first subband group having low frequencies and signals of a second subband group having high frequencies based on a predetermined frequency band; receiving truncated subband filter coefficients for filtering the multi-audio signals of the first subband group, the truncated subband filter coefficients being at least a portion of subband filter coefficients of the first subband group obtained from binaural room impulse response (BRIR) filter coefficients for binaural filtering of the multi-audio signals and the lengths of the truncated subband filter coefficients being determined based on filter order information obtained by at least partially using characteristic information extracted from the corresponding subband filter coefficients; filtering subband signals of the first subband group using the truncated subband filter coefficients; receiving at least one parameter corresponding to each subband signal of the second subband group, the at least one parameter being extracted from subband filter coefficients corresponding to each subband signal of the second subband group; and performing tap-delay line filtering of the subband signals of the second subband group by using the received parameter.

Still yet another exemplary embodiment of the present invention provides an apparatus for processing an audio signal, which is used for performing binaural rendering for multi-audio signals including multi-channel or multi-object signals, the multi-audio signals each including a plurality of subband signals and the plurality of subband signals including signals of a first subband group having low frequencies and signals of a second subband group having high frequencies based on a predetermined frequency band, including: a fast convolution unit performing rendering of each subband signal of the first subband group; and a tap-delay line processing unit performing rendering of each subband signal of the second subband group, wherein the fast convolution unit receives truncated subband filter coefficients for filtering the multi-audio signals of the first subband group, the truncated subband filter coefficients being at least a portion of subband filter coefficients obtained from binaural room impulse response (BRIR) filter coefficients for binaural filtering of the multi-audio signals of the first subband group, the lengths of the truncated subband filter coefficients being determined based on filter order information obtained by at least partially using characteristic information extracted from the corresponding subband filter coefficients, and filters the subband signal of the first subband group by using the truncated subband filter coefficients, and the tap-delay line processing unit receives at least one parameter corresponding to each subband signal of the second subband group, the at least one parameter being extracted from subband filter coefficients corresponding to each subband signal of the second subband group, and performs tap-delay line filtering of the subband signals of the second subband group by using the received parameter.

The method may further include coupling 2-channel left and right subband signals generated by filtering the subband signals of the first subband group and 2-channel left and right subband signals generated by tap-delay line filtering the subband signals of the second subband group; and QMF-synthesizing the respective coupled left and right subband signals.

Advantageous Effects

According to exemplary embodiments of the present invention, when binaural rendering for multi-channel or multi-object signals is performed, it is possible to remarkably decrease a computational complexity while minimizing the loss of sound quality.

According to the exemplary embodiments of the present invention, it is possible to achieve binaural rendering of high sound quality for multi-channel or multi-object audio signals of which real-time processing has been unavailable in the existing low-power device.

BEST MODE

As terms used in the specification, general terms which are currently widely used as possible by considering functions in the present invention are selected, but they may be changed depending on intentions of those skilled in the art, customs, or the appearance of a new technology. Further, in a specific case, terms arbitrarily selected by an applicant may be used and in this case, meanings thereof are descried in the corresponding description part of the present invention. Therefore, it will be disclosed that the terms used in the specifications should be analyzed based on not just names of the terms but substantial meanings of the terms and contents throughout the specification.

Figure 1:
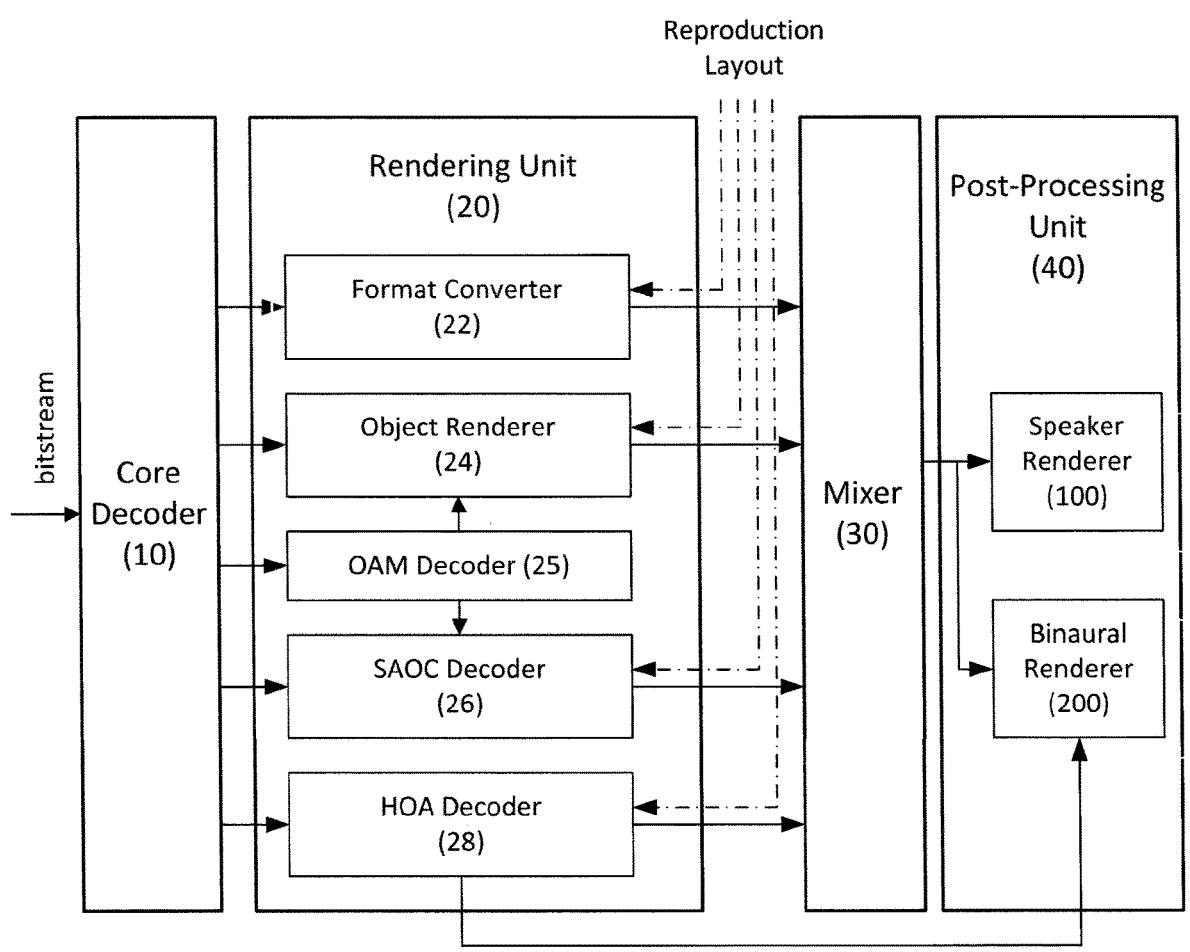
FIG. 1 is a block diagram illustrating an audio signal decoder according to an exemplary embodiment of the present invention.

FIG. 1 is a block diagram illustrating an audio signal decoder according to an exemplary embodiment of the present invention. The audio signal decoder according to the present invention includes a core decoder 10, a rendering unit 20, a mixer 30, and a post-processing unit 40.

First, the core decoder 10 decodes loudspeaker channel signals, discrete object signals, object downmix signals, and pre-rendered signals. According to an exemplary embodiment, in the core decoder 10, a codec based on unified speech and audio coding (USAC) may be used. The core decoder 10 decodes a received bitstream and transfers the decoded bitstream to the rendering unit 20.

The rendering unit 20 performs rendering signals decoded by the core decoder 10 by using reproduction layout information. The rendering unit 20 may include a format converter 22, an object renderer 24, an OAM decoder 25, an SAOC decoder 26, and an HOA decoder 28. The rendering unit 20 performs rendering by using any one of the above components according to the type of decoded signal.

The format converter 22 converts transmitted channel signals into output speaker channel signals. That is, the format converter 22 performs conversion between a transmitted channel configuration and a speaker channel configuration to be reproduced. When the number (for example, 5.1 channels) of output speaker channels is smaller than the number (for example, 22.2 channels) of transmitted channels or the transmitted channel configuration is different from the channel configuration to be reproduced, the format converter 22 performs downmix of transmitted channel signals. The audio signal decoder of the present invention may generate an optimal downmix matrix by using a combination of the input channel signals and the output speaker channel signals and perform the downmix by using the matrix. According to the exemplary embodiment of the present invention, the channel signals processed by the format converter 22 may include pre-rendered object signals. According to an exemplary embodiment, at least one object signal is pre-rendered before encoding the audio signal to be mixed with the channel signals. The mixed object signal as described above may be converted into the output speaker channel signal by the format converter 22 together with the channel signals.

The object renderer 24 and the SAOC decoder 26 perform rendering for an object based audio signals. The object based audio signal may include a discrete object waveform and a parametric object waveform. In the case of the discrete object waveform, each of the object signals is provided to an encoder in a monophonic waveform, and the encoder transmits each of the object signals by using single channel elements (SCEs). In the case of the parametric object waveform, a plurality of object signals is downmixed to at least one channel signal, and a feature of each object and the relationship among the objects are expressed as a spatial audio object coding (SAOC) parameter. The object signals are downmixed to be encoded to core codec and parametric information generated at this time is transmitted to a decoder together.

Meanwhile, when the discrete object waveform or the parametric object waveform is transmitted to an audio signal decoder, compressed object metadata corresponding thereto may be transmitted together. The object metadata quantizes an object attribute by the units of a time and a space to designate a position and a gain value of each object in 3D space. The OAM decoder 25 of the rendering unit 20 receives the compressed object metadata and decodes the received object metadata, and transfers the decoded object metadata to the object renderer 24 and/or the SAOC decoder 26.

The object renderer 24 performs rendering each object signal according to a given reproduction format by using the object metadata. In this case, each object signal may be rendered to specific output channels based on the object metadata. The SAOC decoder 26 restores the object/channel signal from decoded SAOC transmission channels and parametric information. The SAOC decoder 26 may generate an output audio signal based on the reproduction layout information and the object metadata. As such, the object renderer 24 and the SAOC decoder 26 may render the object signal to the channel signal.

The HOA decoder 28 receives Higher Order Ambisonics (HOA) coefficient signals and HOA additional information and decodes the received HOA coefficient signals and HOA additional information. The HOA decoder 28 models the channel signals or the object signals by a separate equation to generate a sound scene. When a spatial location of a speaker in the generated sound scene is selected, rendering to the loudspeaker channel signals may be performed.

Meanwhile, although not illustrated in FIG. 1, when the audio signal is transferred to each component of the rendering unit 20, dynamic range control (DRC) may be performed as a preprocessing process. The DRC limits a dynamic range of the reproduced audio signal to a predetermined level and adjusts a sound, which is smaller than a predetermined threshold, to be larger and a sound, which is larger than the predetermined threshold, to be smaller.

A channel based audio signal and the object based audio signal, which are processed by the rendering unit 20, are transferred to the mixer 30. The mixer 30 adjusts delays of a channel based waveform and a rendered object waveform, and sums up the adjusted waveforms by the unit of a sample. Audio signals summed up by the mixer 30 are transferred to the post-processing unit 40.

The post-processing unit 40 includes a speaker renderer 100 and a binaural renderer 200. The speaker renderer 100 performs post-processing for outputting the multi-channel and/or multi-object audio signals transferred from the mixer 30. The post-processing may include the dynamic range control (DRC), loudness normalization (LN), a peak limiter (PL), and the like.

The binaural renderer 200 generates a binaural downmix signal of the multi-channel and/or multi-object audio signals. The binaural downmix signal is a 2-channel audio signal that allows each input channel/object signal to be expressed by a virtual sound source positioned in 3D. The binaural renderer 200 may receive the audio signal provided to the speaker renderer 100 as an input signal. Binaural rendering may be performed based on binaural room impulse response (BRIR) filters and performed in a time domain or a QMF domain. According to an exemplary embodiment, as a post-processing process of the binaural rendering, the dynamic range control (DRC), the loudness normalization (LN), the peak limiter (PL), and the like may be additionally performed.

Figure 2:
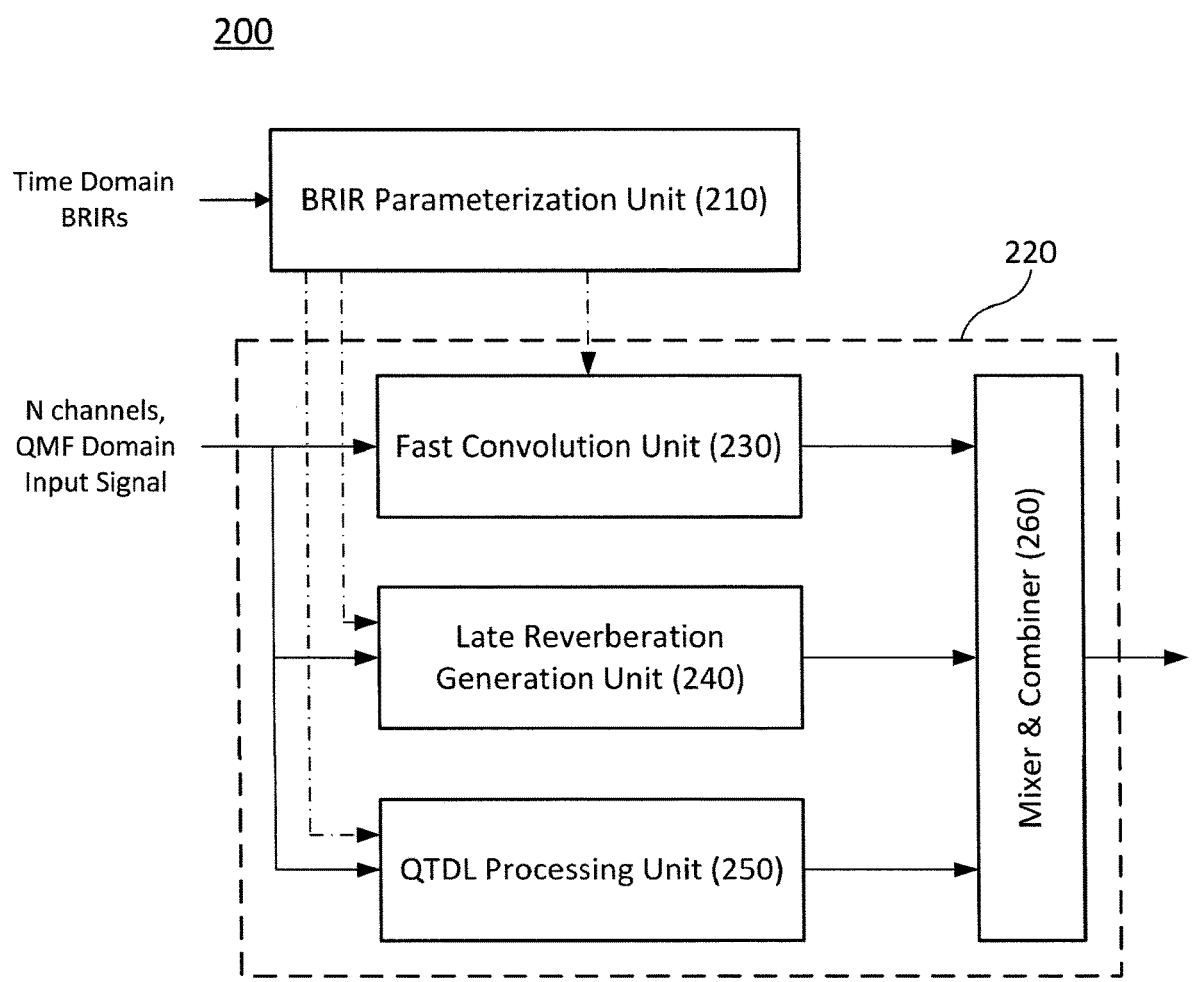
FIG. 2 is a block diagram illustrating each component of a binaural renderer according to an exemplary embodiment of the present invention.

FIG. 2 is a block diagram illustrating each component of a binaural renderer according to an exemplary embodiment of the present invention. As illustrated in FIG. 2, the binaural renderer 200 according to the exemplary embodiment of the present invention may include a BRIR parameterization unit 210, a fast convolution unit 230, a late reverberation generation unit 240, a QTDL processing unit 250, and a mixer & combiner 260.

The binaural renderer 200 generates a 3D audio headphone signal (that is, a 3D audio 2-channel signal) by performing binaural rendering of various types of input signals. In this case, the input signal may be an audio signal including at least one of the channel signals (that is, the loudspeaker channel signals), the object signals, and the HOA coefficient signals. According to another exemplary embodiment of the present invention, when the binaural renderer 200 includes a particular decoder, the input signal may be an encoded bitstream of the aforementioned audio signal. The binaural rendering converts the decoded input signal into the binaural downmix signal to make it possible to experience a surround sound at the time of hearing the corresponding binaural downmix signal through a headphone.

According to the exemplary embodiment of the present invention, the binaural renderer 200 may perform the binaural rendering of the input signal in the QMF domain. That is to say, the binaural renderer 200 may receive signals of multi-channels (N channels) of the QMF domain and perform the binaural rendering for the signals of the multi-channels by using a BRIR subband filter of the QMF domain. When a k-th subband signal of an i-th channel, which passed through a QMF analysis filter bank, is represented by $x_{k,i}(l)$ and a time index in a subband domain is represented by I, the binaural rendering in the QMF domain may be expressed by an equation given below.

$$y_k^m(l) = \sum_i x_{k,i}(l) * b_{k,i}^m(l)$$ [Equation 2]

Herein, $m \in \{L, R\}$ and $b_{k,i}^m(l)$ is obtained by converting the time domain BRIR filter into the subband filter of the QMF domain.

That is, the binaural rendering may be performed by a method that divides the channel signals or the object signals of the QMF domain into a plurality of subband signals and convolutes the respective subband signals with BRIR subband filters corresponding thereto, and thereafter, sums up the respective subband signals convoluted with the BRIR subband filters.

The BRIR parameterization unit 210 converts and edits BRIR filter coefficients for the binaural rendering in the QMF domain and generates various parameters. First, the BRIR parameterization unit 210 receives time domain BRIR filter coefficients for multi-channels or multi-objects, and converts the received time domain BRIR filter coefficients into QMF domain BRIR filter coefficients. In this case, the QMF domain BRIR filter coefficients include a plurality of subband filter coefficients corresponding to a plurality of frequency bands, respectively. In the present invention, the subband filter coefficients indicate each BRIR filter coefficients of a QMF-converted subband domain. In the specification, the subband filter coefficients may be designated as the BRIR subband filter coefficients. The BRIR parameterization unit 210 may edit each of the plurality of BRIR subband filter coefficients of the QMF domain and transfer the edited subband filter coefficients to the fast convolution unit 230, and the like. According to the exemplary embodiment of the present invention, the BRIR parameterization unit 210 may be included as a component of the binaural renderer 200 and, otherwise provided as a separate apparatus. According to an exemplary embodiment, a component including the fast convolution unit 230, the late reverberation generation unit 240, the QTDL processing unit 250, and the mixer & combiner 260, except for the BRIR parameterization unit 210, may be classified into a binaural rendering unit 220.

According to an exemplary embodiment, the BRIR parameterization unit 210 may receive BRIR filter coefficients corresponding to at least one location of a virtual reproduction space as an input. Each location of the virtual reproduction space may correspond to each speaker location of a multi-channel system. According to an exemplary embodiment, each of the BRIR filter coefficients received by the BRIR parameterization unit 210 may directly match each channel or each object of the input signal of the binaural renderer 200. On the contrary, according to another exemplary embodiment of the present invention, each of the received BRIR filter coefficients may have an independent configuration from the input signal of the binaural renderer 200. That is, at least a part of the BRIR filter coefficients received by the BRIR parameterization unit 210 may not directly match the input signal of the binaural renderer 200, and the number of received BRIR filter coefficients may be smaller or larger than the total number of channels and/or objects of the input signal.

According to the exemplary embodiment of the present invention, the BRIR parameterization unit 210 converts and edits the BRIR filter coefficients corresponding to each channel or each object of the input signal of the binaural renderer 200 to transfer the converted and edited BRIR filter coefficients to the binaural rendering unit 220. The corresponding BRIR filter coefficients may be a matching BRIR or a fallback BRIR for each channel or each object. The BRIR matching may be determined whether BRIR filter coefficients targeting the location of each channel or each object are present in the virtual reproduction space. When the BRIR filter coefficients targeting at least one of the locations of the respective channels or the respective objects of the input signal are present, the BRIR filter coefficients may be the matching BRIR of the input signal. However, when the BRIR filter coefficients targeting the location of a specific channel or object is not present, the binaural rendering unit 220 may provide BRIR filter coefficients, which target a location most similar to the corresponding channel or object, as the fallback BRIR for the corresponding channel or object.

Meanwhile, according to another exemplary embodiment of the present invention, the BRIR parameterization unit 210 converts and edits all of the received BRIR filter coefficients to transfer the converted and edited BRIR filter coefficients to the binaural rendering unit 220. In this case, a selection procedure of the BRIR filter coefficients (alternatively, the edited BRIR filter coefficients) corresponding to each channel or each object of the input signal may be performed by the binaural rendering unit 220.

The binaural rendering unit 220 includes a fast convolution unit 230, a late reverberation generation unit 240, and a QTDL processing unit 250 and receives multi-audio signals including multi-channel and/or multi-object signals. In the specification, the input signal including the multi-channel and/or multi-object signals will be referred to as the multi-audio signals. FIG. 2 illustrates that the binaural rendering unit 220 receives the multi-channel signals of the QMF domain according to an exemplary embodiment, but the input signal of the binaural rendering unit 220 may further include time domain multi-channel signals and time domain multi-object signals. Further, when the binaural rendering unit 220 additionally includes a particular decoder, the input signal may be an encoded bitstream of the multi-audio signals. Moreover, in the specification, the present invention is described based on a case of performing BRIR rendering of the multi-audio signals, but the present invention is not limited thereto. That is, features provided by the present invention may be applied to not only the BRIR but also other types of rendering filters and applied to not only the multi-audio signals but also an audio signal of a single channel or single object.

The fast convolution unit 230 performs a fast convolution between the input signal and the BRIR filter to process direct sound and early reflections sound for the input signal. To this end, the fast convolution unit 230 may perform the fast convolution by using a truncated BRIR. The truncated BRIR includes a plurality of subband filter coefficients truncated dependently on each subband frequency and is generated by the BRIR parameterization unit 210. In this case, the length of each of the truncated subband filter coefficients is determined dependently on a frequency of the corresponding subband. The fast convolution unit 230 may perform variable order filtering in a frequency domain by using the truncated subband filter coefficients having different lengths according to the subband. That is, the fast convolution may be performed between QMF domain subband audio signals and the truncated subband filters of the QMF domain corresponding thereto for each frequency band. In the specification, a direct sound and early reflections (D&E) part may be referred to as a front (F)-part.

The late reverberation generation unit 240 generates a late reverberation signal for the input signal. The late reverberation signal represents an output signal which follows the direct sound and the early reflections sound generated by the fast convolution unit 230. The late reverberation generation unit 240 may process the input signal based on reverberation time information determined by each of the subband filter coefficients transferred from the BRIR parameterization unit 210. According to the exemplary embodiment of the present invention, the late reverberation generation unit 240 may generate a mono or stereo downmix signal for an input audio signal and perform late reverberation processing of the generated downmix signal. In the specification, a late reverberation (LR) part may be referred to as a parametric (P)-part.

The QMF domain tapped delay line (QTDL) processing unit 250 processes signals in high-frequency bands among the input audio signals. The QTDL processing unit 250 receives at least one parameter, which corresponds to each subband signal in the high-frequency bands, from the BRIR parameterization unit 210 and performs tap-delay line filtering in the QMF domain by using the received parameter. According to the exemplary embodiment of the present invention, the binaural renderer 200 separates the input audio signals into low-frequency band signals and high-frequency band signals based on a predetermined constant or a predetermined frequency band, and the low-frequency band signals may be processed by the fast convolution unit 230 and the late reverberation generation unit 240, and the high frequency band signals may be processed by the QTDL processing unit 250, respectively.

Each of the fast convolution unit 230, the late reverberation generation unit 240, and the QTDL processing unit 250 outputs the 2-channel QMF domain subband signal. The mixer & combiner 260 combines and mixes the output signal of the fast convolution unit 230, the output signal of the late reverberation generation unit 240, and the output signal of the QTDL processing unit 250. In this case, the combination of the output signals is performed separately for each of left and right output signals of 2 channels. The binaural renderer 200 performs QMF synthesis to the combined output signals to generate a final output audio signal in the time domain.

Hereinafter, various exemplary embodiments of the fast convolution unit 230, the late reverberation generation unit 240, and the QTDL processing unit 250 which are illustrated in FIG. 2, and a combination thereof will be described in detail with reference to each drawing.

FIGS. 3 to 7 illustrate various exemplary embodiments of an apparatus for processing an audio signal according to the present invention. In the present invention, the apparatus for processing an audio signal may indicate the binaural renderer 200 or the binaural rendering unit 220, which is illustrated in FIG. 2, as a narrow meaning. However, in the present invention, the apparatus for processing an audio signal may indicate the audio signal decoder of FIG. 1, which includes the binaural renderer, as a broad meaning. Each binaural renderer illustrated in FIGS. 3 to 7 may indicate only some components of the binaural renderer 200 illustrated in FIG. 2 for the convenience of description. Further, hereinafter, in the specification, an exemplary embodiment of the multi-channel input signals will be primarily described, but unless otherwise described, a channel, multi-channels, and the multi-channel input signals may be used as concepts including an object, multi-objects, and the multi-object input signals, respectively. Moreover, the multi-channel input signals may also be used as a concept including an HOA decoded and rendered signal.

Figure 3:
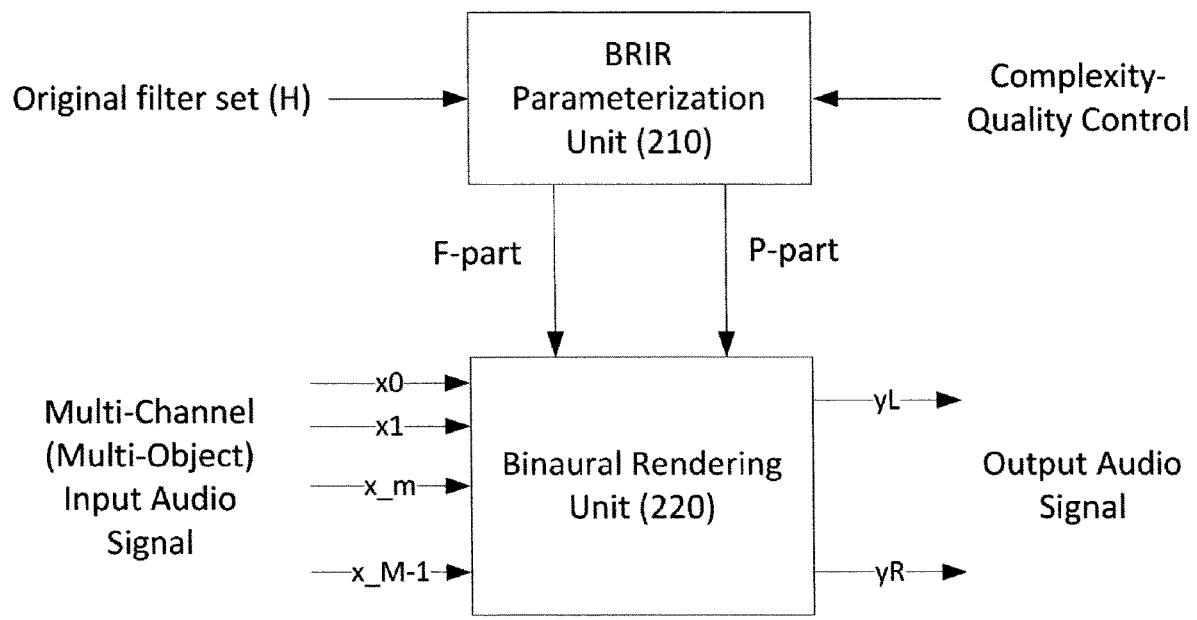
FIGS. 3 to 7 are diagrams illustrating various exemplary embodiments of an apparatus for processing an audio signal according to the present invention.

FIG. 3 illustrates a binaural renderer 200A according to an exemplary embodiment of the present invention. When the binaural rendering using the BRIR is generalized, the binaural rendering is M-to-O processing for acquiring O output signals for the multi-channel input signals having M channels. Binaural filtering may be regarded as filtering using filter coefficients corresponding to each input channel and each output channel during such a process. In FIG. 3, an original filter set H means transfer functions up to locations of left and right ears from a speaker location of each channel signal. A transfer function measured in a general listening room, that is, a reverberant space among the transfer functions is referred to as the binaural room impulse response (BRIR). On the contrary, a transfer function measured in an anechoic room so as not to be influenced by the reproduction space is referred to as a head related impulse response (HRIR), and a transfer function therefor is referred to as a head related transfer function (HRTF). Accordingly, differently from the HRTF, the BRIR contains information of the reproduction space as well as directional information. According to an exemplary embodiment, the BRIR may be substituted by using the HRTF and an artificial reverberator. In the specification, the binaural rendering using the BRIR is described, but the present invention is not limited thereto, and the present invention may be similarly applied even to the binaural rendering using various types of FIR filters. Meanwhile, the BRIR may have a length of 96K samples as described above, and since multi-channel binaural rendering is performed by using different M*O filters, a processing process with a high computational complexity is required.

According to the exemplary embodiment of the present invention, the BRIR parameterization unit 210 may generate filter coefficients transformed from the original filter set H for optimizing the computational complexity. The BRIR parameterization unit 210 separates original filter coefficients into front (F)-part coefficients and parametric (P)-part coefficients. Herein, the F-part represents a direct sound and early reflections (D&E) part, and the P-part represents a late reverberation (LR) part. For example, original filter coefficients having a length of 96K samples may be separated into each of an F-part in which only front 4K samples are truncated and a P-part which is a part corresponding to residual 92K samples.

The binaural rendering unit 220 receives each of the F-part coefficients and the P-part coefficients from the BRIR parameterization unit 210 and performs rendering the multi-channel input signals by using the received coefficients. According to the exemplary embodiment of the present invention, the fast convolution unit 230 illustrated in FIG. 2 may render the multi-audio signals by using the F-part coefficients received from the BRIR parameterization unit 210, and the late reverberation generation unit 240 may render the multi-audio signals by using the P-part coefficients received from the BRIR parameterization unit 210. That is, the fast convolution unit 230 and the late reverberation generation unit 240 may correspond to an F-part rendering unit and a P-part rendering unit of the present invention, respectively. According to an exemplary embodiment, F-part rendering (binaural rendering using the F-part coefficients) may be implemented by a general finite impulse response (FIR) filter, and P-part rendering (binaural rendering using the P-part coefficients) may be implemented by a parametric method. Meanwhile, a complexity-quality control input provided by a user or a control system may be used to determine information generated to the F-part and/or the P-part.

Figure 4:
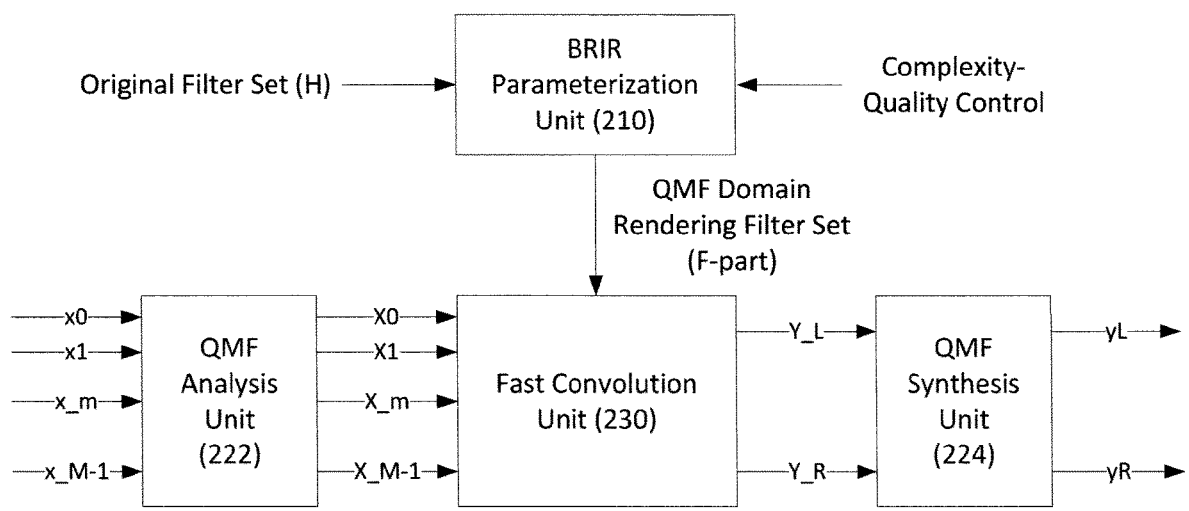

FIG. 4 illustrates a more detailed method that implements F-part rendering by a binaural renderer 200B according to another exemplary embodiment of the present invention. For the convenience of description, the P-part rendering unit is omitted in FIG. 4. Further, FIG. 4 illustrates a filter implemented in the QMF domain, but the present invention is not limited thereto and may be applied to subband processing of other domains.

Referring to FIG. 4, the F-part rendering may be performed by the fast convolution unit 230 in the QMF domain. For rendering in the QMF domain, a QMF analysis unit 222 converts time domain input signals x0, x1, . . . x_M−1 into QMF domain signals X0, X1, . . . X_M−1. In this case, the input signals x0, x1, . . . x_M−1 may be the multi-channel audio signals, that is, channel signals corresponding to the 22.2-channel speakers. In the QMF domain, a total of 64 subbands may be used, but the present invention is not limited thereto. Meanwhile, according to the exemplary embodiment of the present invention, the QMF analysis unit 222 may be omitted from the binaural renderer 200B. In the case of HE-AAC or USAC using spectral band replication (SBR), since processing is performed in the QMF domain, the binaural renderer 200B may immediately receive the QMF domain signals X0, X1, . . . X_M−1 as the input without QMF analysis. Accordingly, when the QMF domain signals are directly received as the input as described above, the QMF used in the binaural renderer according to the present invention is the same as the QMF used in the previous processing unit (that is, the SBR). A QMF synthesis unit 244 QMF-synthesizes left and right signals Y_L and Y_R of 2 channels, in which the binaural rendering is performed, to generate 2-channel output audio signals yL and yR of the time domain.

Figure 5:
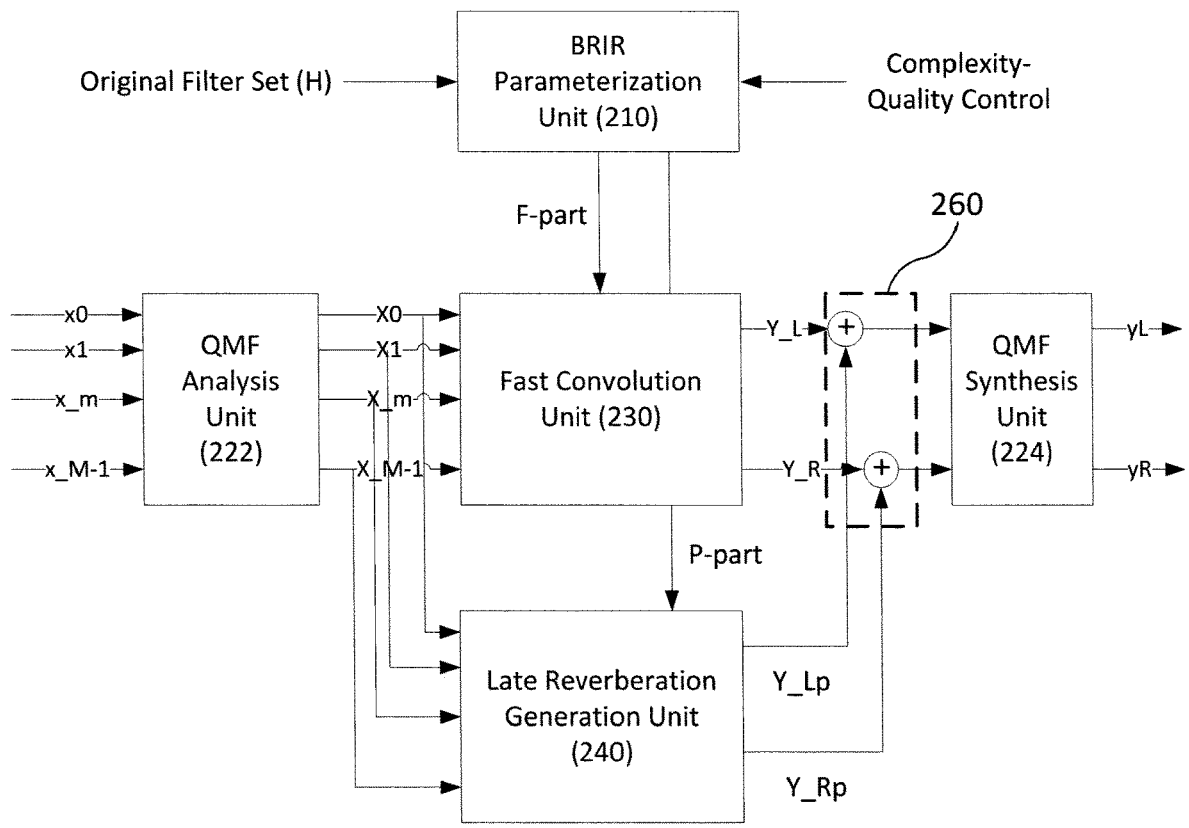
Figure 6:
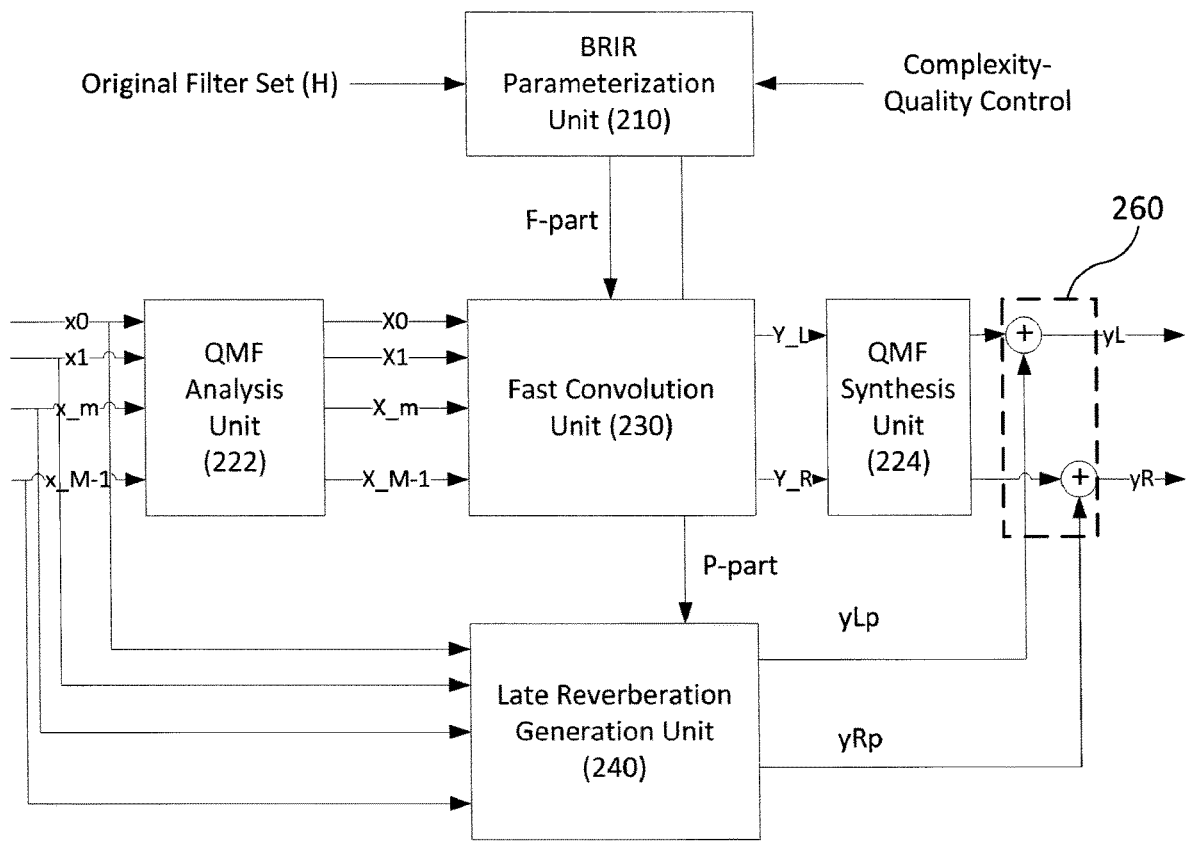
Figure 7:
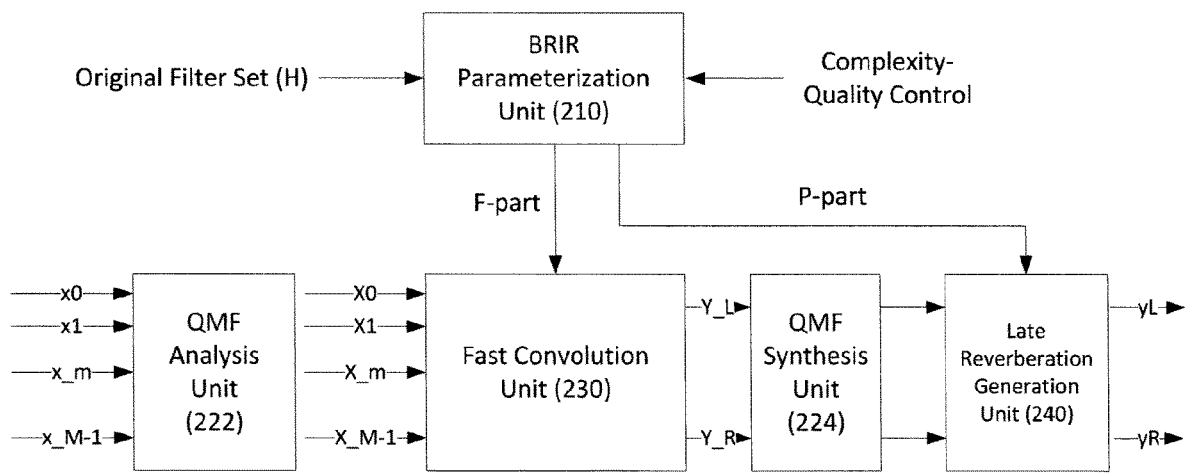

FIGS. 5 to 7 illustrate exemplary embodiments of binaural renderers 200C, 200D, and 200E, which perform both F-part rendering and P-part rendering, respectively. In the exemplary embodiments of FIGS. 5 to 7, the F-part rendering is performed by the fast convolution unit 230 in the QMF domain, and the P-part rendering is performed by the late reverberation generation unit 240 in the QMF domain or the time domain. In the exemplary embodiments of FIGS. 5 to 7, detailed description of parts duplicated with the exemplary embodiments of the previous drawings will be omitted.

Referring to FIG. 5, the binaural renderer 200C may perform both the F-part rendering and the P-part rendering in the QMF domain. That is, the QMF analysis unit 222 of the binaural renderer 200C converts time domain input signals x0, x1, . . . x_M−1 into QMF domain signals X0, X1, . . . X_M−1 to transfer each of the converted QMF domain signals X0, X1, . . . X_M−1 to the fast convolution unit 230 and the late reverberation generation unit 240. The fast convolution unit 230 and the late reverberation generation unit 240 render the QMF domain signals X0, X1, . . . X_M−1 to generate 2-channel output signals Y_L, Y_R and Y_Lp, Y_Rp, respectively. In this case, the fast convolution unit 230 and the late reverberation generation unit 240 may perform rendering by using the F-part filter coefficients and the P-part filter coefficients received by the BRIR parameterization unit 210, respectively. The output signals Y_L and Y_R of the F-part rendering and the output signals Y_Lp and Y_Rp of the P-part rendering are combined for each of the left and right channels in the mixer & combiner 260 and transferred to the QMF synthesis unit 224. The QMF synthesis unit 224 QMF-synthesizes input left and right signals of 2 channels to generate 2-channel output audio signals yL and yR of the time domain.

Referring to FIG. 6, the binaural renderer 200D may perform the F-part rendering in the QMF domain and the P-part rendering in the time domain. The QMF analysis unit 222 of the binaural renderer 200D QMF-converts the time domain input signals and transfers the converted time domain input signals to the fast convolution unit 230. The fast convolution unit 230 performs F-part rendering the QMF domain signals to generate the 2-channel output signals Y_L and Y_R. The QMF synthesis unit 224 converts the output signals of the F-part rendering into the time domain output signals and transfers the converted time domain output signals to the mixer & combiner 260. Meanwhile, the late reverberation generation unit 240 performs the P-part rendering by directly receiving the time domain input signals. The output signals yLp and yRp of the P-part rendering are transferred to the mixer & combiner 260. The mixer & combiner 260 combines the F-part rendering output signal and the P-part rendering output signal in the time domain to generate the 2-channel output audio signals yL and yR in the time domain.

In the exemplary embodiments of FIGS. 5 and 6, the F-part rendering and the P-part rendering are performed in parallel, while according to the exemplary embodiment of FIG. 7, the binaural renderer 200E may sequentially perform the F-part rendering and the P-part rendering. That is, the fast convolution unit 230 may perform F-part rendering the QMF-converted input signals, and the QMF synthesis unit 224 may convert the F-part-rendered 2-channel signals Y_L and Y_R into the time domain signal and thereafter, transfer the converted time domain signal to the late reverberation generation unit 240. The late reverberation generation unit 240 performs P-part rendering the input 2-channel signals to generate 2-channel output audio signals yL and yR of the time domain.

FIGS. 5 to 7 illustrate exemplary embodiments of performing the F-part rendering and the P-part rendering, respectively, and the exemplary embodiments of the respective drawings are combined and modified to perform the binaural rendering. That is to say, in each exemplary embodiment, the binaural renderer may downmix the input signals into the 2-channel left and right signals or a mono signal and thereafter perform P-part rendering the downmix signal as well as discretely performing the P-part rendering each of the input multi-audio signals.

<Variable Order Filtering in Frequency-Domain (VOFF)>

Figure 8:
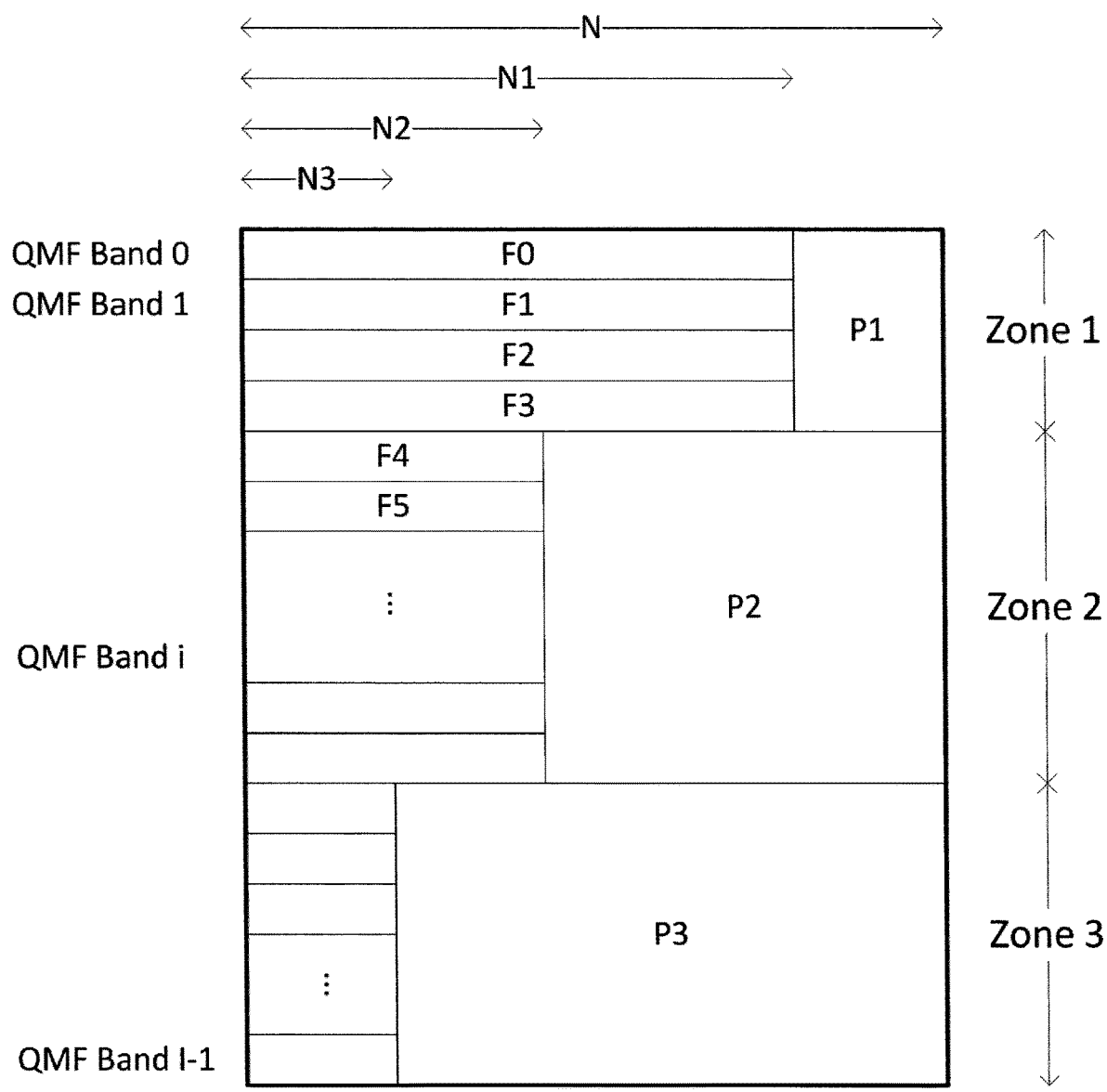
FIGS. 8 to 10 are diagrams illustrating methods for generating an FIR filter for binaural rendering according to exemplary embodiments of the present invention.
Figure 9:
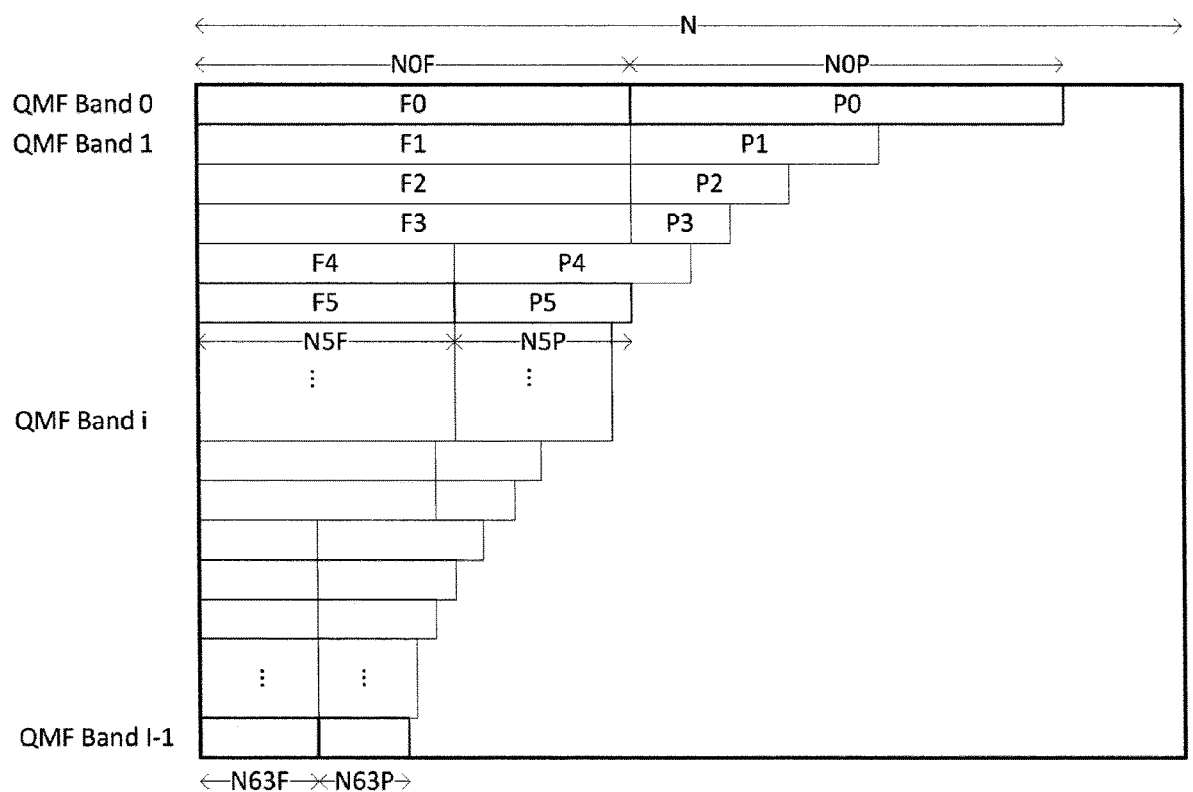
Figure 10:
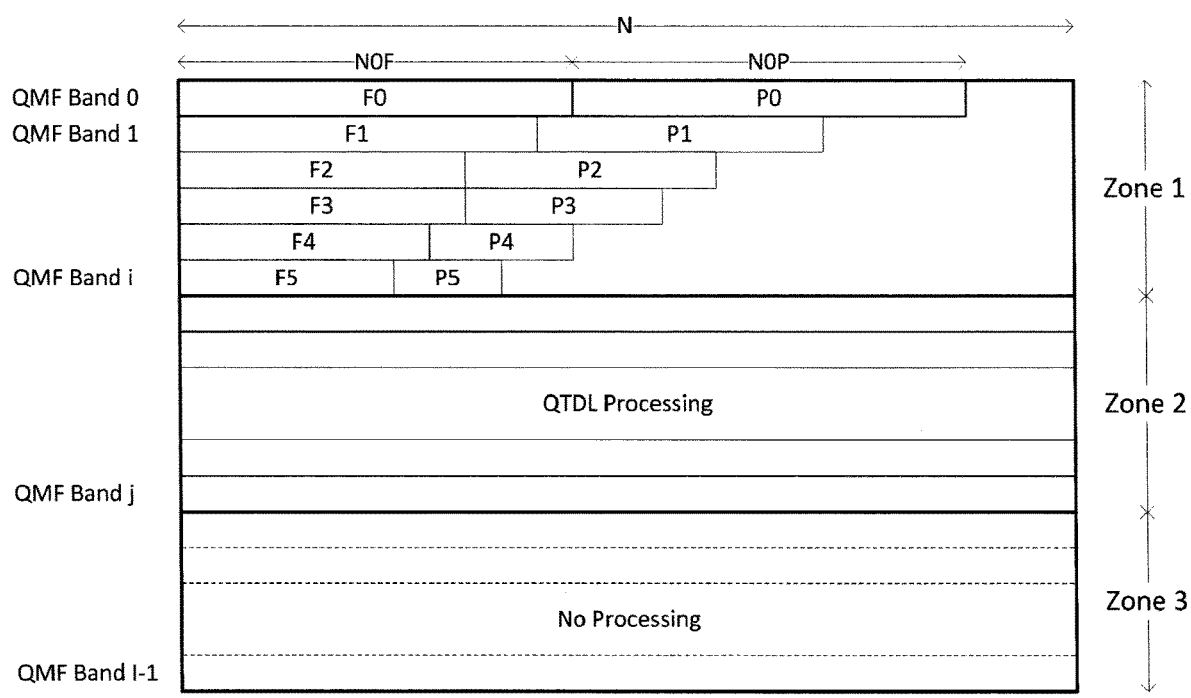

FIGS. 8 to 10 illustrate methods for generating an FIR filter for binaural rendering according to exemplary embodiments of the present invention. According to the exemplary embodiments of the present invention, an FIR filter, which is converted into the plurality of subband filters of the QMF domain, may be used for the binaural rendering in the QMF domain. In this case, subband filters truncated dependently on each subband may be used for the F-part rendering. That is, the fast convolution unit of the binaural renderer may perform variable order filtering in the QMF domain by using the truncated subband filters having different lengths according to the subband. Hereinafter, the exemplary embodiments of the filter generation in FIGS. 8 to 10, which will be described below, may be performed by the BRIR parameterization unit 210 of FIG. 2.

FIG. 8 illustrates an exemplary embodiment of a length according to each QMF band of a QMF domain filter used for binaural rendering. In the exemplary embodiment of FIG. 8, the FIR filter is converted into I QMF subband filters, and Fi represents a truncated subband filter of a QMF subband i. In the QMF domain, a total of 64 subbands may be used, but the present invention is not limited thereto. Further, N represents the length (the number of taps) of the original subband filter, and the lengths of the truncated subband filters are represented by N1, N2, and N3, respectively. In this case, the lengths N, N1, N2, and N3 represent the number of taps in a downsampled QMF domain (that is, QMF timeslot).

According to the exemplary embodiment of the present invention, the truncated subband filters having different lengths N1, N2, and N3 according to each subband may be used for the F-part rendering. In this case, the truncated subband filter is a front filter truncated in the original subband filter and may be also designated as a front subband filter. Further, a rear part after truncating the original subband filter may be designated as a rear subband filter and used for the P-part rendering.

In the case of rendering using the BRIR filter, a filter order (that is, filter length) for each subband may be determined based on parameters extracted from an original BRIR filter, that is, reverberation time (RT) information for each subband filter, an energy decay curve (EDC) value, energy decay time information, and the like. A reverberation time may vary depending on the frequency due to acoustic characteristics in which decay in air and a sound-absorption degree depending on materials of a wall and a ceiling vary for each frequency. In general, a signal having a lower frequency has a longer reverberation time. Since the long reverberation time means that more information remains in the rear part of the FIR filter, it is preferable to truncate the corresponding filter long in normally transferring reverberation information. Accordingly, the length of each truncated subband filter of the present invention is determined based at least in part on the characteristic information (for example, reverberation time information) extracted from the corresponding subband filter.

The length of the truncated subband filter may be determined according to various exemplary embodiments. First, according to an exemplary embodiment, each subband may be classified into a plurality of groups, and the length of each truncated subband filter may be determined according to the classified groups. According to an example of FIG. 8, each subband may be classified into three zones Zone 1, Zone 2, and Zone 3, and truncated subband filters of Zone 1 corresponding to a low frequency may have a longer filter order (that is, filter length) than truncated subband filters of Zone 2 and Zone 3 corresponding to a high frequency. Further, the filter order of the truncated subband filter of the corresponding zone may gradually decrease toward a zone having a high frequency.

According to another exemplary embodiment of the present invention, the length of each truncated subband filter may be determined independently and variably for each subband according to characteristic information of the original subband filter. The length of each truncated subband filter is determined based on the truncation length determined in the corresponding subband and is not influenced by the length of a truncated subband filter of a neighboring or another subband. That is to say, the lengths of some or all truncated subband filters of Zone 2 may be longer than the length of at least one truncated subband filter of Zone 1.

According to yet another exemplary embodiment of the present invention, the variable order filtering in frequency domain may be performed with respect to only some of subbands classified into the plurality of groups. That is, truncated subband filters having different lengths may be generated with respect to only subbands that belong to some group(s) among at least two classified groups. According to an exemplary embodiment, the group in which the truncated subband filter is generated may be a subband group (that is to say, Zone 1) classified into low-frequency bands based on a predetermined constant or a predetermined frequency band.

The length of the truncated filter may be determined based on additional information obtained by the apparatus for processing an audio signal, that is, complexity, a complexity level (profile), or required quality information of the decoder. The complexity may be determined according to a hardware resource of the apparatus for processing an audio signal or a value directly input by the user. The quality may be determined according to a request of the user or determined with reference to a value transmitted through the bitstream or other information included in the bitstream. Further, the quality may also be determined according to a value obtained by estimating the quality of the transmitted audio signal, that is to say, as a bit rate is higher, the quality may be regarded as a higher quality. In this case, the length of each truncated subband filter may proportionally increase according to the complexity and the quality and may vary with different ratios for each band. Further, in order to acquire an additional gain by high-speed processing such as FFT to be described below, and the like, the length of each truncated subband filter may be determined as a size unit corresponding to the additional gain, that is to say, a multiple of the power of 2. On the contrary, when the determined length of the truncated subband filter is longer than a total length of an actual subband filter, the length of the truncated subband filter may be adjusted to the length of the actual subband filter.

The BRIR parameterization unit generates the truncated subband filter coefficients (F-part coefficients) corresponding to the respective truncated subband filters determined according to the aforementioned exemplary embodiment, and transfers the generated truncated subband filter coefficients to the fast convolution unit. The fast convolution unit performs the variable order filtering in frequency domain of each subband signal of the multi-audio signals by using the truncated subband filter coefficients.

FIG. 9 illustrates another exemplary embodiment of a length for each QMF band of a QMF domain filter used for binaural rendering. In the exemplary embodiment of FIG. 9, duplicative description of parts, which are the same as or correspond to the exemplary embodiment of FIG. 8, will be omitted.

In the exemplary embodiment of FIG. 9, each of Fi_L and Fi_R represents a truncated subband filter (front subband filter) used for the F-part rendering of the QMF subband i, and Pi represents a rear subband filter used for the P-part rendering of the QMF subband i. N represents the length (the number of taps) of the original subband filter, and NiF and NiP represent the lengths of a front subband filter and a rear subband filter of the subband i, respectively. As described above, NiF and NiP represent the number of taps in the downsampled QMF domain.

According to the exemplary embodiment of FIG. 9, the length of the rear subband filter may also be determined based on the parameters extracted from the original subband filter as well as the front subband filter. That is, the lengths of the front subband filter and the rear subband filter of each subband are determined based at least in part on the characteristic information extracted in the corresponding subband filter. For example, the length of the front subband filter may be determined based on first reverberation time information of the corresponding subband filter, and the length of the rear subband filter may be determined based on second reverberation time information. That is, the front subband filter may be a filter at a truncated front part based on the first reverberation time information in the original subband filter, and the rear subband filter may be a filter at a rear part corresponding to a zone between a first reverberation time and a second reverberation time as a zone which follows the front subband filter. According to an exemplary embodiment, the first reverberation time information may be RT20, and the second reverberation time information may be RT60, but the present invention is not limited thereto.

A part where an early reflections sound part is switched to a late reverberation sound part is present within a second reverberation time. That is, a point is present, where a zone having a deterministic characteristic is switched to a zone having a stochastic characteristic, and the point is called a mixing time in terms of the BRIR of the entire band. In the case of a zone before the mixing time, information providing directionality for each location is primarily present, and this is unique for each channel. On the contrary, since the late reverberation part has a common feature for each channel, it may be efficient to process a plurality of channels at once. Accordingly, the mixing time for each subband is estimated to perform the fast convolution through the F-part rendering before the mixing time and perform processing in which a common characteristic for each channel is reflected through the P-part rendering after the mixing time.

However, an error may occur by a bias from a perceptual viewpoint at the time of estimating the mixing time. Therefore, performing the fast convolution by maximizing the length of the F-part is more excellent from a quality viewpoint than separately processing the F-part and the P-part based on the corresponding boundary by estimating an accurate mixing time. Therefore, the length of the F-part, that is, the length of the front subband filter may be longer or shorter than the length corresponding to the mixing time according to complexity-quality control.

Moreover, in order to reduce the length of each subband filter, in addition to the aforementioned truncation method, when a frequency response of a specific subband is monotonic, modeling that reduces the filter of the corresponding subband to a low order is available. As a representative method, there is FIR filter modeling using frequency sampling, and a filter minimized from a least square viewpoint may be designed.

According to the exemplary embodiment of the present invention, the lengths of the front subband filter and/or the rear subband filter for each subband may have the same value for each channel of the corresponding subband. An error in measurement may be present in the BRIR, and an error element such as the bias, or the like is present even in estimating the reverberation time. Accordingly, in order to reduce the influence, the length of the filter may be determined based on a mutual relationship between channels or between subbands. According to an exemplary embodiment, the BRIR parameterization unit may extract first characteristic information (that is to say, the first reverberation time information) from the subband filter corresponding to each channel of the same subband and acquire single filter order information (alternatively, first truncation point information) for the corresponding subband by combining the extracted first characteristic information. The front subband filter for each channel of the corresponding subband may be determined to have the same length based on the obtained filter order information (alternatively, first truncation point information). Similarly, the BRIR parameterization unit may extract second characteristic information (that is to say, the second reverberation time information) from the subband filter corresponding to each channel of the same subband and acquire second truncation point information, which is to be commonly applied to the rear subband filter corresponding to each channel of the corresponding subband, by combining the extracted second characteristic information. Herein, the front subband filter may be a filter at a truncated front part based on the first truncation point information in the original subband filter, and the rear subband filter may be a filter at a rear part corresponding to a zone between the first truncation point and the second truncation point as a zone which follows the front subband filter.

Meanwhile, according to another exemplary embodiment of the present invention, only the F-part processing may be performed with respect to subbands of a specific subband group. In this case, when processing is performed with respect to the corresponding subband by using only a filter up to the first truncation point, distortion at a level for the user to perceive may occur due to a difference in energy of processed filter as compared with the case in which the processing is performed by using the whole subband filter. In order to prevent the distortion, energy compensation for an area which is not used for the processing, that is, an area following the first truncation point may be achieved in the corresponding subband filter. The energy compensation may be performed by dividing the F-part coefficients (front subband filter coefficients) by filter power up to the first truncation point of the corresponding subband filter and multiplying the divided F-part coefficients (front subband filter coefficients) by energy of a desired area, that is, total power of the corresponding subband filter. Accordingly, the energy of the F-part coefficients may be adjusted to be the same as the energy of the whole subband filter. Further, although the P part coefficients are transmitted from the BRIR parameterization unit, the binaural rendering unit may not perform the P-part processing based on the complexity-quality control. In this case, the binaural rendering unit may perform the energy compensation for the F-part coefficients by using the P-part coefficients.

In the F-part processing by the aforementioned methods, the filter coefficients of the truncated subband filters having different lengths for each subband are obtained from a single time domain filter (that is, a proto-type filter). That is, since the single time domain filter is converted into a plurality of QMF subband filters and the lengths of the filters corresponding to each subband are varied, each truncated subband filter is obtained from a single proto-type filter.

The BRIR parameterization unit generates the front subband filter coefficients (F-part coefficients) corresponding to each front subband filter determined according to the aforementioned exemplary embodiment and transfers the generated front subband filter coefficients to the fast convolution unit. The fast convolution unit performs the variable order filtering in frequency domain of each subband signal of the multi-audio signals by using the received front subband filter coefficients. Further, the BRIR parameterization unit may generate the rear subband filter coefficients (P-part coefficients) corresponding to each rear subband filter determined according to the aforementioned exemplary embodiment and transfer the generated rear subband filter coefficients to the late reverberation generation unit. The late reverberation generation unit may perform reverberation processing of each subband signal by using the received rear subband filter coefficients. According to the exemplary embodiment of the present invention, the BRIR parameterization unit may combine the rear subband filter coefficients for each channel to generate downmix subband filter coefficients (downmix P-part coefficients) and transfer the generated downmix subband filter coefficients to the late reverberation generation unit. As described below, the late reverberation generation unit may generate 2-channel left and right subband reverberation signals by using the received downmix subband filter coefficients.

FIG. 10 illustrates yet another exemplary embodiment of a method for generating an FIR filter used for binaural rendering. In the exemplary embodiment of FIG. 10, duplicative description of parts, which are the same as or correspond to the exemplary embodiment of FIGS. 8 and 9, will be omitted.

Referring to FIG. 10, the plurality of subband filters, which are QMF-converted, may be classified into the plurality of groups, and different processing may be applied for each of the classified groups. For example, the plurality of subbands may be classified into a first subband group Zone 1 having low frequencies and a second subband group Zone 2 having high frequencies based on a predetermined frequency band (QMF band i). In this case, the F-part rendering may be performed with respect to input subband signals of the first subband group, and QTDL processing to be described below may be performed with respect to input subband signals of the second subband group.

Accordingly, the BRIR parameterization unit generates the front subband filter coefficients for each subband of the first subband group and transfers the generated front subband filter coefficients to the fast convolution unit. The fast convolution unit performs the F-part rendering of the subband signals of the first subband group by using the received front subband filter coefficients. According to an exemplary embodiment, the P-part rendering of the subband signals of the first subband group may be additionally performed by the late reverberation generation unit. Further, the BRIR parameterization unit obtains at least one parameter from each of the subband filter coefficients of the second subband group and transfers the obtained parameter to the QTDL processing unit. The QTDL processing unit performs tap-delay line filtering of each subband signal of the second subband group as described below by using the obtained parameter. According to the exemplary embodiment of the present invention, the predetermined frequency (QMF band i) for distinguishing the first subband group and the second subband group may be determined based on a predetermined constant value or determined according to a bitstream characteristic of the transmitted audio input signal. For example, in the case of the audio signal using the SBR, the second subband group may be set to correspond to an SBR bands.

According to another exemplary embodiment of the present invention, the plurality of subbands may be classified into three subband groups based on a predetermined first frequency band (QMF band i) and a predetermined second frequency band (QMF band j). That is, the plurality of subbands may be classified into a first subband group Zone 1 which is a low-frequency zone equal to or lower than the first frequency band, a second subband group Zone 2 which is an intermediate-frequency zone higher than the first frequency band and equal to or lower than the second frequency band, and a third subband group Zone 3 which is a high-frequency zone higher than the second frequency band. In this case, the F-part rendering and the QTDL processing may be performed with respect to subband signals of the first subband group and subband signals of the second subband group, respectively, as described above, and rendering may not be performed with respect to subband signals of the third subband group.

<Late Reverberation Rendering>

Next, various exemplary embodiments of the P-part rendering of the present invention will be described with reference to FIGS. 11 to 14. That is, various exemplary embodiments of the late reverberation generation unit 240 of FIG. 2, which performs the P-part rendering in the QMF domain, will be described with reference to FIGS. 11 to 14. In the exemplary embodiments of FIGS. 11 to 14, it is assumed that the multi-channel input signals are received as the subband signals of the QMF domain. Accordingly, processing of respective components of FIGS. 11 to 14, that is, a decorrelator 241, a subband filtering unit 242, an IC matching unit 243, a downmix unit 244, and an energy decay matching unit 246 may be performed for each QMF subband. In the exemplary embodiments of FIGS. 11 to 14, detailed description of parts duplicated with the exemplary embodiments of the previous drawings will be omitted.

In the exemplary embodiments of FIGS. 8 to 10, Pi (P1, P2, P3, . . . ) corresponding to the P-part is a rear part of each subband filter removed by frequency variable truncation and generally includes information on late reverberation. The length of the P-part may be defined as a whole filter after a truncation point of each subband filter according to the complexity-quality control, or defined as a smaller length with reference to the second reverberation time information of the corresponding subband filter.

The P-part rendering may be performed independently for each channel or performed with respect to a downmixed channel. Further, the P-part rendering may be applied through different processing for each predetermined subband group or for each subband, or applied to all subbands as the same processing. In this case, processing applicable to the P-part may include energy decay compensation, tap-delay line filtering, processing using an infinite impulse response (IIR) filter, processing using an artificial reverberator, frequency-independent interaural coherence (FIIC) compensation, frequency-dependent interaural coherence (FDIC) compensation, and the like for input signals.

Meanwhile, it is important to generally conserve two features, that is, features of energy decay relief (EDR) and frequency-dependent interaural coherence (FDIC) for parametric processing for the P-part. First, when the P-part is observed from an energy viewpoint, it can be seen that the EDR may be the same or similar for each channel. Since the respective channels have common EDR, it is appropriate to downmix all channels to one or two channel(s) and thereafter, perform the P-part rendering of the downmixed channel(s) from the energy viewpoint. In this case, an operation of the P-part rendering, in which M convolutions need to be performed with respect to M channels, is decreased to the M-to-O downmix and one (alternatively, two) convolution, thereby providing a gain of a significant computational complexity.

Next, a process of compensating for the FDIC is required in the P-part rendering. There are various methods of estimating the FDIC, but the following equation may be used.

$$IC(i) = \frac{\Re\left[\sum_{k=0}^{K} H_L(i,k) H_R(i,k)^*\right]}{\sqrt{\sum_{k=0}^{K} |H_L(i,k)|^2 \sum_{k=0}^{K} |H_R(i,k)|^2}} \quad \text{[Equation 3]}$$

Herein, $H_m(i,k)$ represents a short time Fourier transform (STFT) coefficient of an impulse response $h_m(n)$, n represents a time index, i represents a frequency index, k represents a frame index, and m represents an output channel index L or R. Further, a function $\Re(x)$ of a numerator outputs a real-number value of an input x, and x* represents a complex conjugate value of x. A numerator part in the equation may be substituted with a function having an absolute value instead of the real-number value.

Meanwhile, in the present invention, since the binaural rendering is performed in the QMF domain, the FDIC may be defined by an equation given below.

$$IC(i) = \frac{\Re\left[\sum_{k=0}^{K} h_L(i,k) h_R(i,k)^*\right]}{\sqrt{\sum_{k=0}^{K} |h_L(i,k)|^2 \sum_{k=0}^{K} |h_R(i,k)|^2}} \quad \text{[Equation 4]}$$

Herein, i represents a subband index, k represents a time index in the subband, and $h_m(i,k)$ represents the subband filter of the BRIR.

The FDIC of the late reverberation part is a parameter primarily influenced by locations of two microphones when the BRIR is recorded, and is not influenced by the location of the speaker, that is, a direction and a distance. When it is assumed that a head of a listener is a sphere, theoretical FDIC $IC_{ideal}$ of the BRIR may satisfy an equation given below.

$$IC_{ideal}(k) = \frac{\sin(kr)}{kr} \quad \text{[Equation 5]}$$

Herein, r represents a distance between both ears of the listener, that is, a distance between two microphones, and k represents the frequency index.

When the FDIC using the BRIRs of the plurality of channels is analyzed, it can be seen that the early reflections sound primarily included in the F-part varies for each channel. That is, the FDIC of the F-part varies very differently for each channel. Meanwhile, the FDIC varies very largely in the case of high-frequency bands, but the reason is that a large measurement error occurs due to a characteristic of high-frequency band signals of which energy is rapidly decayed, and when an average for each channel is obtained, the FDIC is almost converged to 0. On the contrary, a difference in FDIC for each channel occurs due to the measurement error even in the case of the P-part, but it can be confirmed that the FDIC is averagely converged to a sync function shown in Equation 5. According to the exemplary embodiment of the present invention, the late reverberation generation unit for the P-part rendering may be implemented based on the aforementioned characteristic.

Figure 11:
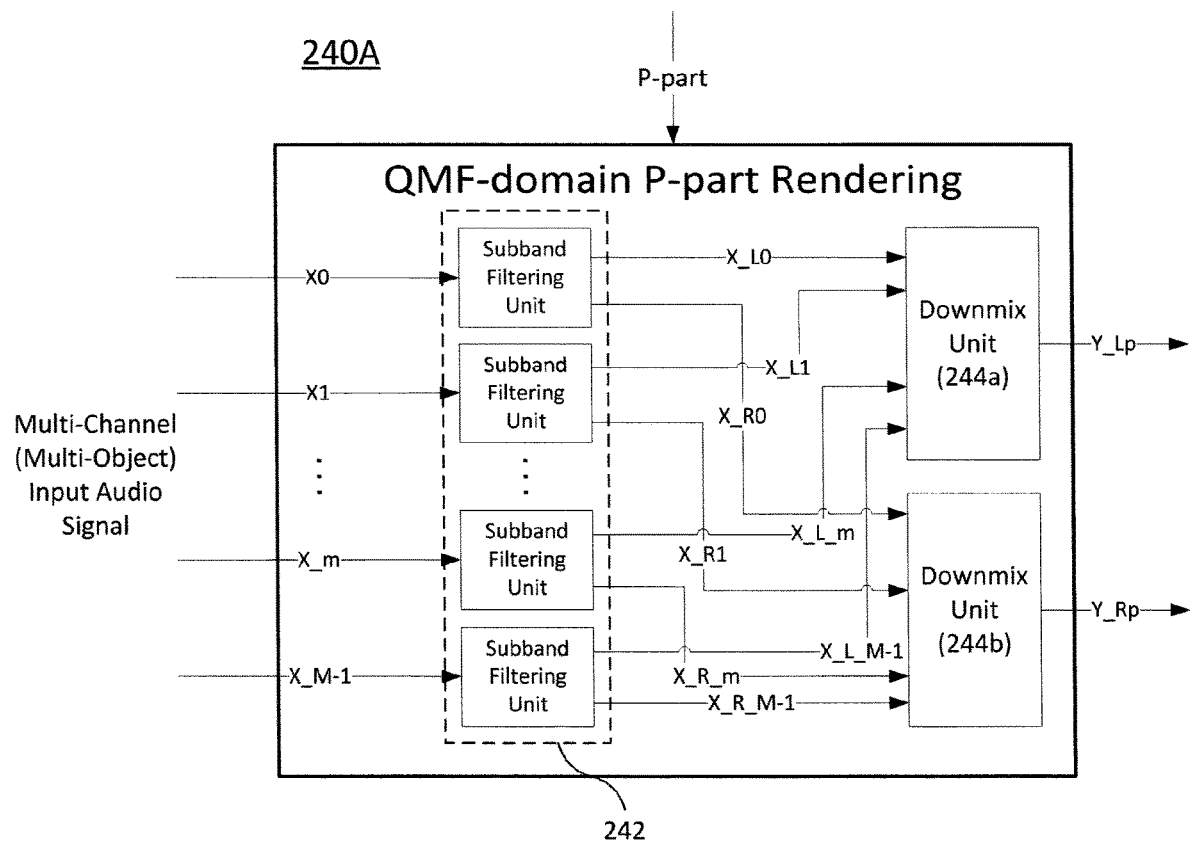
FIGS. 11 to 14 are diagrams illustrating various exemplary embodiments of a P-part rendering unit of the present invention.

FIG. 11 illustrates a late reverberation generation unit 240A according to an exemplary embodiment of the present invention. According to the exemplary embodiment of FIG. 11, the late reverberation generation unit 240A may include a subband filtering unit 242 and downmix units 244a and 244b.

The subband filtering unit 242 filters the multi-channel input signals X0, X1, ..., X_M−1 for each subband by using the P-part coefficients. The P-part coefficients may be received from the BRIR parameterization unit (not illustrated) as described above and include coefficients of rear subband filters having different lengths for each subband. The subband filtering unit 242 performs fast convolution between the QMF domain subband signal and the rear subband filter of the QMF domain corresponding thereto for each frequency. In this case, the length of the rear subband filter may be determined based on the RT60 as described above, but set to a value larger or smaller than the RT60 according to the complexity-quality control.

The multi-channel input signals are rendered to X_L0, X_L1, ..., XL M−1, which are left-channel signals, and X_R0, X_R1, ..., X_R_M−1, which are right-channel signals, by the subband filtering unit 242, respectively. The downmix units 244a and 244b downmix the plurality of rendered left-channel signals and the plurality of rendered right-channel signals for left and right channels, respectively, to generate 2-channel left and right output signals Y_Lp and Y_Rp.

Figure 12:
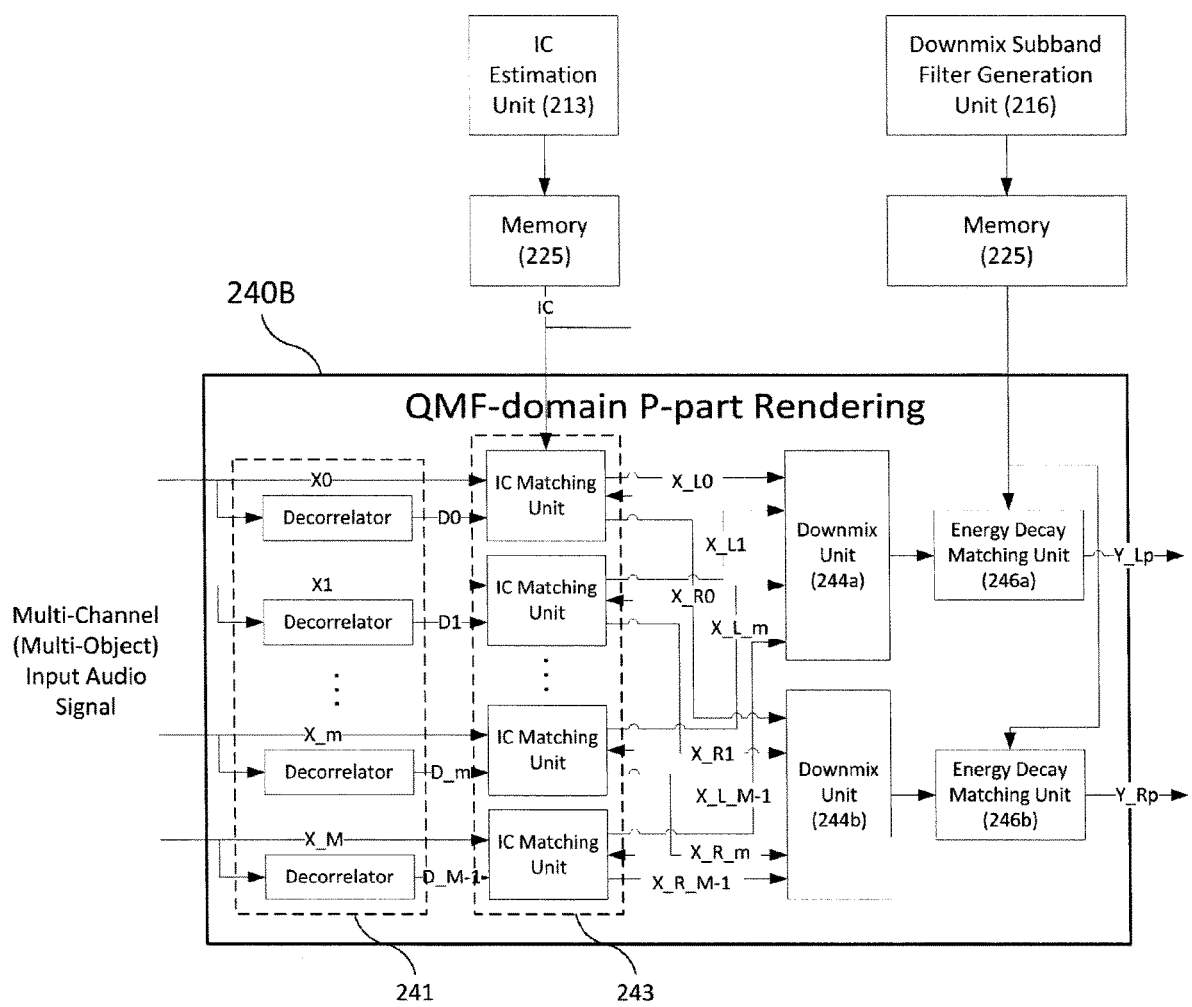

FIG. 12 illustrates a late reverberation generation unit 240B according to another exemplary embodiment of the present invention. According to the exemplary embodiment of FIG. 12, the late reverberation generation unit 240B may include a decorrelator 241, an IC matching unit 243, downmix units 244a and 244b, and energy decay matching units 246a and 246b. Further, for processing of the late reverberation generation unit 240B, the BRIR parameterization unit (not illustrated) may include an IC estimation unit 213 and a downmix subband filter generation unit 216.

According to the exemplary embodiment of FIG. 12, the late reverberation generation unit 240B may reduce the computational complexity by using that energy decay characteristics of the late reverberation part for respective channels are the same as each other. That is, the late reverberation generation unit 240B performs decorrelation and interaural coherence (IC) adjustment of each multi-channel signal, downmixes adjusted input signals and decorrelation signals for each channel to left and right-channel signals, and compensates for energy decay of the downmixed signals to generate the 2-channel left and right output signals. In more detail, the decorrelator 241 generates decorrelation signals D0, D1, ..., D_M−1 for respective multi-channel input signals X0, X1, ..., X_M−1. The decorrelator 241 is a kind of preprocessor for adjusting coherence between both ears, and may adopt a phase randomizer, and a phase of an input signal may be changed by a unit of 90° for efficiency of the computational complexity.

Meanwhile, the IC estimation unit 213 of the BRIR parameterization unit (not illustrated) estimates an IC value and transfers the estimated IC value to the binaural rendering unit (not illustrated). The binaural rendering unit may store the received IC value in a memory 255 and transfers the received IC value to the IC matching unit 243. The IC matching unit may directly receive the IC value from the BRIR parameterization unit and, alternatively, acquire the IC value prestored in the memory 255. The input signals and the decorrelation signals for respective channels are rendered to X_L0, X_L1, . . . , X_L_M−1, which are the left-channel signals, and X_R0, X_R1, . . . , X_R_M−1, which are the right-channel signals, in the IC matching unit 243. The IC matching unit 243 performs weighted summing between the decorrelation signal and the original input signal for each channel by referring to the IC value, and adjusts coherence between both channel signals through the weighted summing. In this case, since the input signal for each channel is a signal of the subband domain, the aforementioned FDIC matching may be achieved. When an original channel signal is represented by X, a decorrelation channel signal is represented by D, and an IC of the corresponding subband is represented by $\phi$, the left and right channel signals X_L and X_R, which are subjected to IC matching, may be expressed by an equation given below.

$$X\_L = \text{sqrt}((1+\phi)/2)X \pm \text{sqrt}((1-\phi)/2)D$$

$$X\_R = \text{sqrt}((1+\phi)/2)X \mp \text{sqrt}((1-\phi)/2)D \quad \text{[Equation 6]}$$

(double signs in same order)

Figure 13:
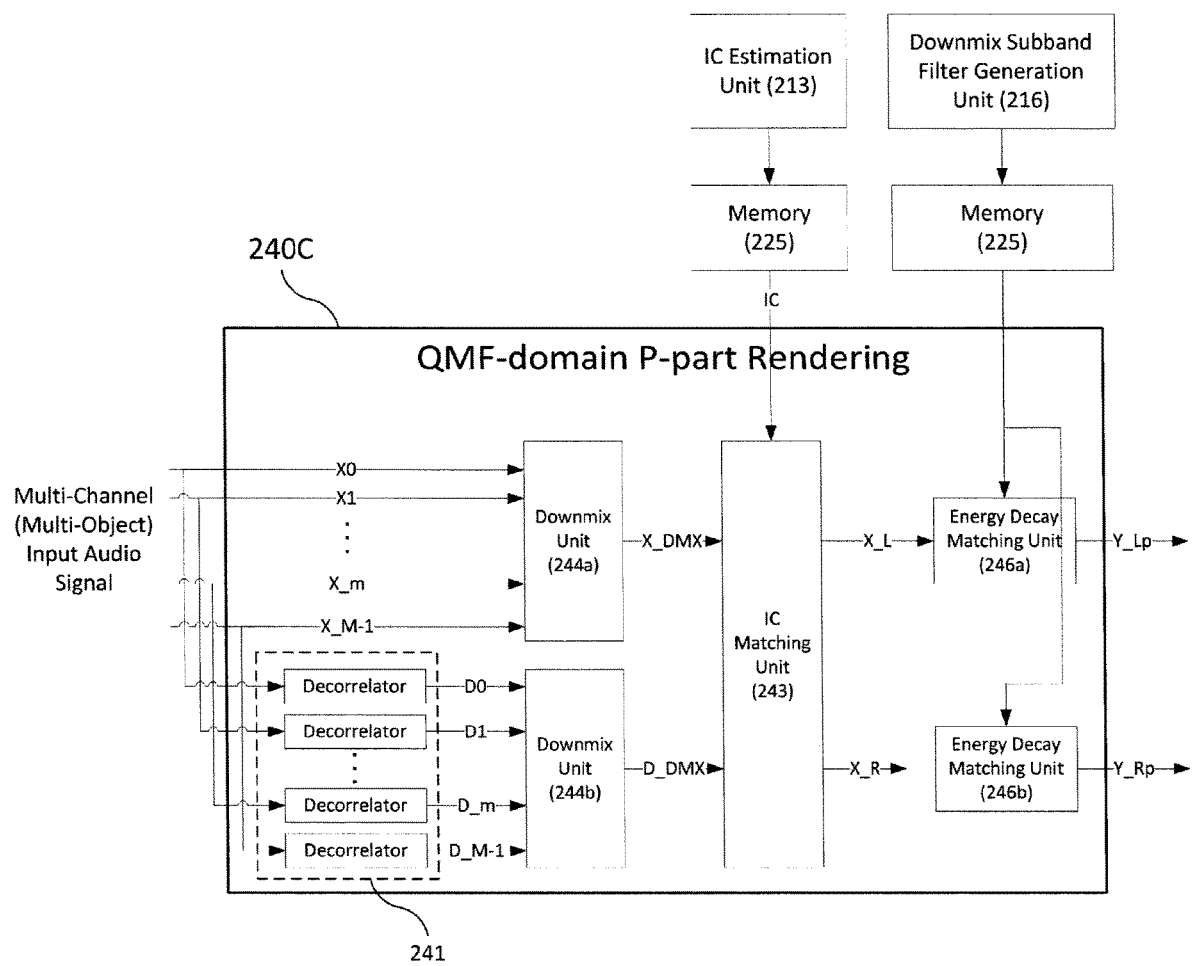

The downmix units 244a and 244b downmix the plurality of rendered left-channel signals and the plurality of rendered right-channel signals for left and right channels, respectively, through the IC matching, thereby generating 2-channel left and right rendering signals. Next, the energy decay matching units 246a and 246b reflect energy decays of the 2-channel left and right rendering signals, respectively, to generate 2-channel left and right output signals Y_Lp and Y_Rp. The energy decay matching units 246a and 246b perform energy decay matching by using the downmix subband filter coefficients obtained from the downmix subband filter generation unit 216. The downmix subband filter coefficients are generated by a combination of the rear subband filter coefficients for respective channels of the corresponding subband. In other words, the downmix subband filter coefficient may include a subband filter coefficient having a root mean square value of amplitude response of the rear subband filter coefficient for each channel with respect to the corresponding subband. Therefore, the downmix subband filter coefficients reflect the energy decay characteristic of the late reverberation part for the corresponding subband signal. The downmix subband filter coefficients may include downmix subband filter coefficients downmixed in mono or stereo according to exemplary embodiments and be directly received from the BRIR parameterization unit similarly to the FDIC or obtained from values prestored in the memory 225. When BRIR in which the F-part is truncated in a k-th channel among M channels is represented by $BRIR_k$, BRIR in which up to N-th sample is truncated in the k-th channel is represented by $BRIR_{T,k}$, and a downmix subband filter coefficient in which energy of a truncated part after the N-th sample is compensated is represented by $BRIR_E$, $BRIR_E$ may be obtained by using an equation given below.

$$BRIR_E(m) = \sqrt{\frac{\sum_{k=0}^{M-1}\sum_{m'=0}^{\infty}(BRIR_k(m'))^2}{\sum_{k=0}^{M-1}\sum_{m'=0}^{N-1}(BRIR_{T,k}(m'))^2}} \sqrt{\frac{\sum_{k=0}^{M-1}(BRIR_{T,k}(m))^2}{M}} \quad \text{[Equation 7]}$$

where $BRIR_{T,k}(m) = \begin{cases} BRIR_k(m) & m < N \\ 0 & \text{otherwise} \end{cases}$ FIG. 13 illustrates a late reverberation generation unit 240C according to yet another exemplary embodiment of the present invention. Respective components of the late reverberation generation unit 240C of FIG. 13 may be the same as the respective components of the late reverberation generation unit 240B described in the exemplary embodiment of FIG. 12, and both the late reverberation generation unit 240C and the late reverberation generation unit 240B may be partially different from each other in data processing order among the respective components.

According to the exemplary embodiment of FIG. 13, the late reverberation generation unit 240C may further reduce the computational complexity by using that the FDICs of the late reverberation part for respective channels are the same as each other. That is, the late reverberation generation unit 240C downmixes the respective multi-channel signals to the left and right channel signals, adjusts ICs of the downmixed left and right channel signals, and compensates for energy decay for the adjusted left and right channel signals, thereby generating the 2-channel left and right output signals.

In more detail, the decorrelator 241 generates decorrelation signals D0, D1, . . . , D_M−1 for respective multi-channel input signals X0, X1, . . . , X_M−1. Next, the downmix units 244a and 244b downmix the multi-channel input signals and the decorrelation signals, respectively, to generate 2-channel downmix signals X_DMX and D_DMX. The IC matching unit 243 performs weighted summing of the 2-channel downmix signals by referring to the IC values to adjust the coherence between both channel signals. The energy decay matching units 246a and 246b perform energy compensation for the left and right channel signals X_L and X_R, which are subjected to the IC matching by the IC matching unit 243, respectively, to generate 2-channel left and right output signals X_Lp and Y_Rp. In this case, energy compensation information used for energy compensation may include downmix subband filter coefficients for each subband.

Figure 14:
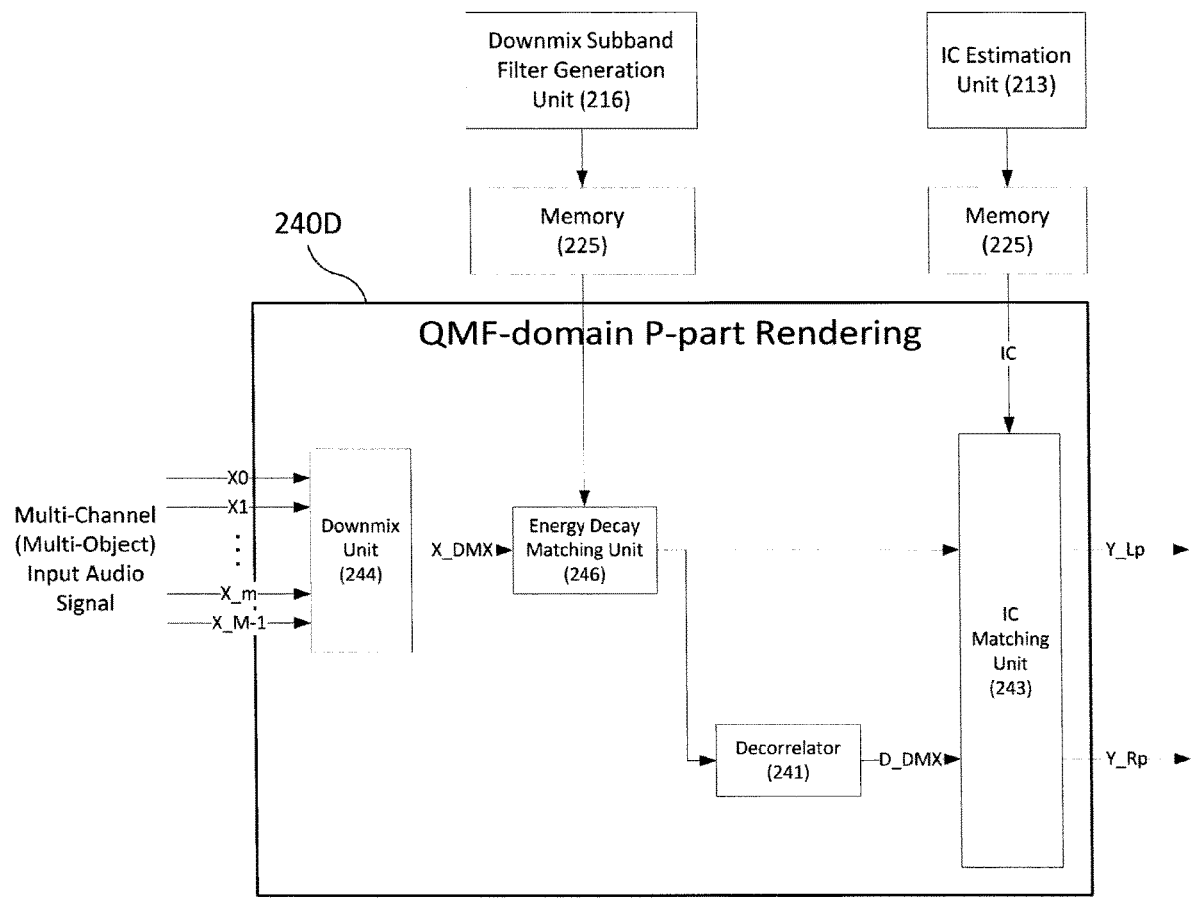

FIG. 14 illustrates a late reverberation generation unit 240D according to still another exemplary embodiment of the present invention. Respective components of the late reverberation generation unit 240D of FIG. 14 may be the same as the respective components of the late reverberation generation units 240B and 240C described in the exemplary embodiments of FIGS. 12 and 13, but have a more simplified feature.

First, the downmix unit 244 downmixes the multi-channel input signals X0, X1, . . . , X_M−1 for each subband to generate a mono downmix signal (that is, a mono subband signal) X_DMX. The energy decay matching unit 246 reflects an energy decay for the generated mono downmix signal. In this case, the downmix subband filter coefficients for each subband may be used in order to reflect the energy decay. Next, the decorrelator 241 generates a decorrelation signal D_DMX of the mono downmix signal reflected with the energy decay. The IC matching unit 243 performs weighted summing of the mono downmix signal reflected with the energy decay and the decorrelation signal by referring to the FDIC value and generates the 2-channel left and right output signals Y_Lp and Y_Rp through the weighted summing. According to the exemplary embodiment of FIG. 14, since energy decay matching is performed with respect to the mono downmix signal X_DMX only once, the computational complexity may be further saved.

<QTDL Processing of High-Frequency Bands>

Next, various exemplary embodiments of the QTDL processing of the present invention will be described with reference to FIGS. 15 and 16. That is, various exemplary embodiments of the QTDL processing unit 250 of FIG. 2, which performs the QTDL processing in the QMF domain, will be described with reference to FIGS. 15 and 16. In the exemplary embodiments of FIGS. 15 and 16, it is assumed that the multi-channel input signals are received as the subband signals of the QMF domain. Therefore, in the exemplary embodiments of FIGS. 15 and 16, a tap-delay line filter and a one-tap-delay line filter may perform processing for each QMF subband. Further, the QTDL processing may be performed only with respect to input signals of high-frequency bands, which are classified based on the predetermined constant or the predetermined frequency band, as described above. When the spectral band replication (SBR) is applied to the input audio signal, the high-frequency bands may correspond to the SBR bands. In the exemplary embodiments of FIGS. 15 and 16, detailed description of parts duplicated with the exemplary embodiments of the previous drawings will be omitted.

The spectral band replication (SBR) used for efficient encoding of the high-frequency bands is a tool for securing a bandwidth as large as an original signal by re-extending a bandwidth which is narrowed by throwing out signals of the high-frequency bands in low-bit rate encoding. In this case, the high-frequency bands are generated by using information of low-frequency bands, which are encoded and transmitted, and additional information of the high-frequency band signals transmitted by the encoder. However, distortion may occur in a high-frequency component generated by using the SBR due to generation of inaccurate harmonic. Further, the SBR bands are the high-frequency bands, and as described above, reverberation times of the corresponding frequency bands are very short. That is, the BRIR subband filters of the SBR bands have small effective information and a high decay rate. Accordingly, in BRIR rendering for the high-frequency bands corresponding to the SBR bands, performing the rendering by using a small number of effective taps may be still more effective in terms of a computational complexity to the sound quality than performing the convolution.

Figure 15:
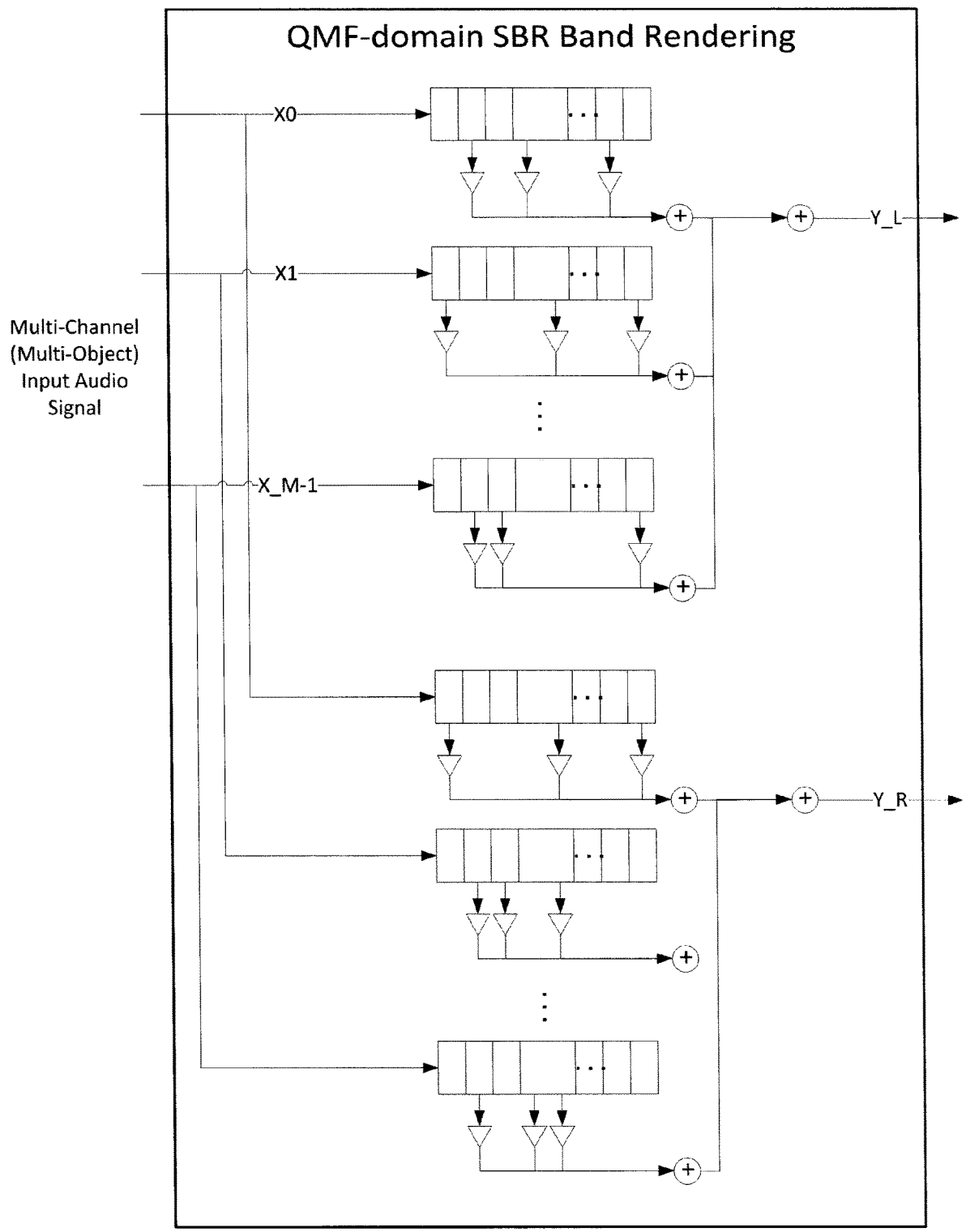
FIGS. 15 and 16 are diagrams illustrating various exemplary embodiments of QTDL processing of the present invention.

FIG. 15 illustrates a QTDL processing unit 250A according to an exemplary embodiment of the present invention. According to the exemplary embodiment of FIG. 15, the QTDL processing unit 250A performs filtering for each subband for the multi-channel input signals X0, X1, . . . , X_M−1 by using the tap-delay line filter. The tap-delay line filter performs convolution of only a small number of predetermined taps with respect to each channel signal. In this case, the small number of taps used at this time may be determined based on a parameter directly extracted from the BRIR subband filter coefficients corresponding to the relevant subband signal. The parameter includes delay information for each tap, which is to be used for the tap-delay line filter, and gain information corresponding thereto.

The number of taps used for the tap-delay line filter may be determined by the complexity-quality control. The QTDL processing unit 250A receives parameter set(s) (gain information and delay information), which corresponds to the relevant number of tap(s) for each channel and for each subband, from the BRIR parameterization unit, based on the determined number of taps. In this case, the received parameter set may be extracted from the BRIR subband filter coefficients corresponding to the relevant subband signal and determined according to various exemplary embodiments. For example, parameter set(s) for respective extracted peaks as many as the determined number of taps among a plurality of peaks of the corresponding BRIR subband filter coefficients in the order of an absolute value, the order of the value of a real part, or the order of the value of an imaginary part may be received. In this case, delay information of each parameter indicates positional information of the corresponding peak and has a sample based integer value in the QMF domain. Further, the gain information is determined based on the size of the peak corresponding to the delay information. In this case, as the gain information, a weighted value of the corresponding peak after energy compensation for whole subband filter coefficients is performed may be used as well as the corresponding peak value itself in the subband filter coefficients. The gain information is obtained by using both a real-number of the weighted value and an imaginary-number of the weighted value for the corresponding peak to thereby have the complex value.

The plurality of channels signals filtered by the tap-delay line filter is summed to the 2-channel left and right output signals Y_L and Y_R for each subband. Meanwhile, the parameter used in each tap-delay line filter of the QTDL processing unit 250A may be stored in the memory during an initialization process for the binaural rendering and the QTDL processing may be performed without an additional operation for extracting the parameter.

Figure 16:
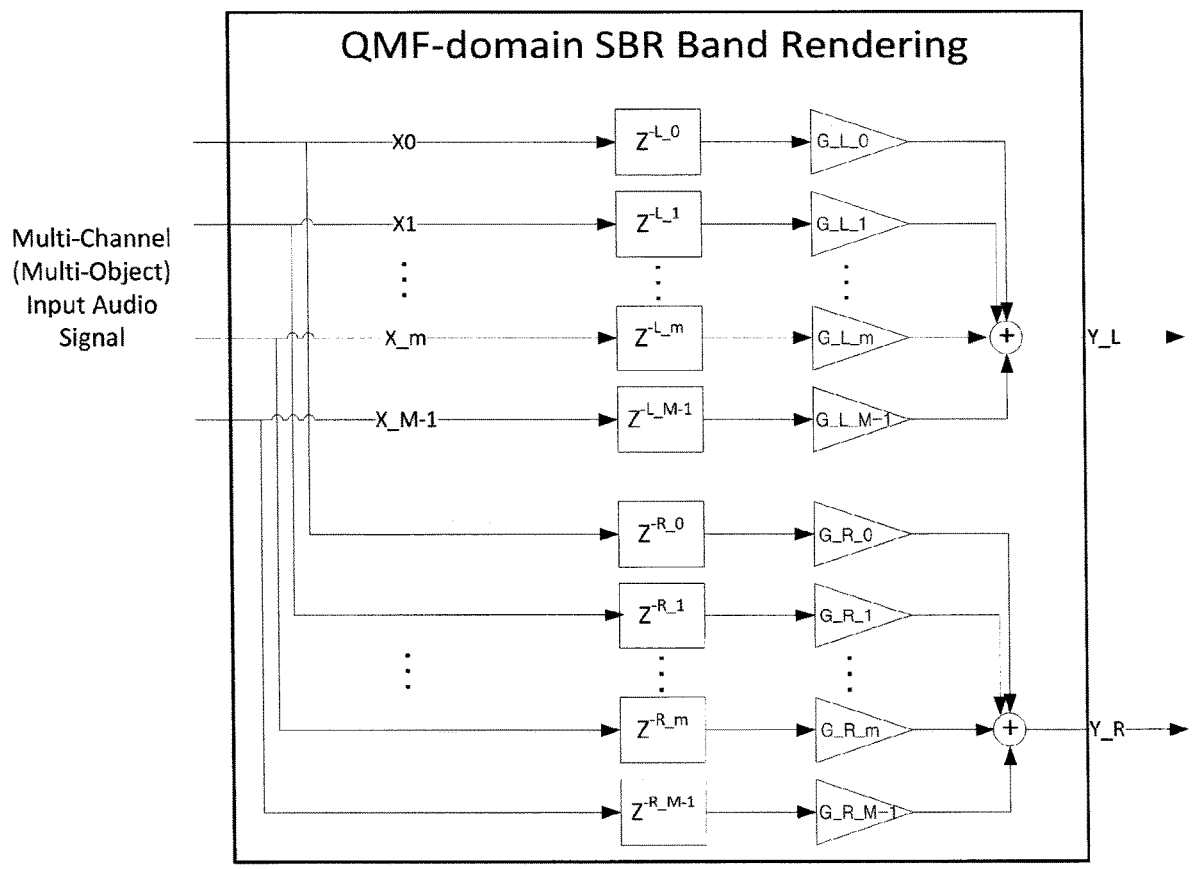

FIG. 16 illustrates a QTDL processing unit 250B according to another exemplary embodiment of the present invention. According to the exemplary embodiment of FIG. 16, the QTDL processing unit 250B performs filtering for each subband for the multi-channel input signals X0, X1, . . . , X_M−1 by using the one-tap-delay line filter. It may be appreciated that the one-tap-delay line filter performs the convolution only in one tap with respect to each channel signal. In this case, the used tap may be determined based on a parameter(s) directly extracted from the BRIR subband filter coefficients corresponding to the relevant subband signal. The parameter(s) includes delay information extracted from the BRIR subband filter coefficients and gain information corresponding thereto.

In FIG. 16, L_0, L_1, . . . L_M−1 represent delays for the BRIRs with respect to M channels-left ear, respectively, and R_0, R_1, . . . , R_M−1 represent delays for the BRIRs with respect to M channels-right ear, respectively. In this case, the delay information represents positional information for the maximum peak in the order of an absolution value, the value of a real part, or the value of an imaginary part among the BRIR subband filter coefficients. Further, in FIG. 16, G_L_0, G_L_1, . . . , G_L_M−1 represent gains corresponding to respective delay information of the left channel and G_R_0, G_R_1, . . . , G_R_M−1 represent gains corresponding to the respective delay information of the right channels, respectively. As described, each gain information is determined based on the size of the peak corresponding to the delay information. In this case, as the gain information, the weighted value of the corresponding peak after energy compensation for whole subband filter coefficients may be used as well as the corresponding peak value itself in the subband filter coefficients. The gain information is obtained by using both the real-number of the weighted value and the imaginary-number of the weighted value for the corresponding peak.

As described in the exemplary embodiment of FIG. 15, the plurality of channel signals filtered by the one-tap-delay line filter are summed with the 2-channel left and right output signals Y_L and Y_R for each subband. Further, the parameter used in each one-tap-delay line filter of the QTDL processing unit 250B may be stored in the memory during the initialization process for the binaural rendering and the QTDL processing may be performed without an additional operation for extracting the parameter.

Hereinabove, the present invention has been descried through the detailed exemplary embodiments, but modification and changes of the present invention can be made by those skilled in the art without departing from the object and the scope of the present invention. That is, the exemplary embodiment of the binaural rendering for the multi-audio signals has been described in the present invention, but the present invention can be similarly applied and extended to even various multimedia signals including a video signal as well as the audio signal. Accordingly, it is analyzed that matters which can easily be analogized by those skilled in the art from the detailed description and the exemplary embodiment of the present invention are included in the claims of the present invention.

MODE FOR INVENTION

As above, related features have been described in the best mode.

INDUSTRIAL APPLICABILITY

The present invention can be applied to various forms of apparatuses for processing a multimedia signal including an apparatus for processing an audio signal and an apparatus for processing a video signal, and the like.

What is claimed is:

1. A method for processing a multimedia signal, the method comprising:
   receiving a multimedia signal and an object signal, wherein the multimedia signal is a channel signal;
   receiving an object metadata;
   receiving a set of filter coefficients for each subband corresponding to a channel configuration to be reproduced, wherein the set of filter coefficients is truncated frequency-dependently from a set of proto-type subband filter coefficients based on a filter order for a corresponding subband, wherein the filter order is determined based at least in part on energy decay time information of the corresponding subband, and wherein the filter order determines a length of the set of filter coefficients for each subband and is determined to be variable in a frequency domain;
   decoding the received object metadata;
   converting a format of the multimedia signal when a channel configuration of the multimedia signal is different from the channel configuration to be reproduced;
   rendering the object signal based on the decoded object metadata according to the channel configuration to be reproduced;
   mixing the multimedia signal with the rendered object signal, wherein the mixing includes adjusting delays of the multimedia signal and the rendered object signal; and
   filtering each subband signal of the mixed multimedia signal by using the set of filter coefficients corresponding thereto.

2. The method of claim 1, wherein the energy decay time information is obtained from one or more sets of proto-type subband filter coefficients for the corresponding subband.

3. The method of claim 1,
   wherein the set of proto-type subband filter coefficients is a set of binaural room impulse response (BRIR) filter coefficients in the frequency domain.

4. The method of claim 3, wherein the energy decay time information includes reverberation time information.

5. The method of claim 1, wherein the filter order has a single value for each subband.

6. An apparatus for processing a multimedia signal, the apparatus comprising:
   a processor configured to:
      receive a multimedia signal and an object signal, wherein the multimedia signal is a channel signal;
      receive an object metadata;
      receive a set of filter coefficients for each subband corresponding to a channel configuration to be reproduced, wherein the set of filter coefficients is truncated frequency-dependently from a set of proto-type subband filter coefficients based on a filter order for a corresponding subband, wherein the filter order is determined based at least in part on energy decay time information of the corresponding subband, and wherein the filter order determines a length of the set of filter coefficients for each subband and is determined to be variable in a frequency domain;
      decode the received object metadata;
      convert a format of the multimedia signal when a channel configuration of the multimedia signal is different from the channel configuration to be reproduced;
      render the object signal based on the decoded object metadata according to the channel configuration to be reproduced;
      mix the multimedia signal with the rendered object signal, wherein the mixing includes adjusting delays of the multimedia signal and the rendered object signal; and
      filter each subband signal of the mixed multimedia signal by using the set of filter coefficients corresponding thereto.

7. The apparatus of claim 6, wherein the energy decay time information is obtained from one or more sets of proto-type subband filter coefficients for the corresponding subband.

8. The apparatus of claim 6,
   wherein the set of proto-type subband filter coefficients is a set of binaural room impulse response (BRIR) filter coefficients in the frequency domain.

9. The apparatus of claim 8, wherein the energy decay time information includes reverberation time information.

10. The apparatus of claim 6, wherein the filter order has a single value for each subband.

* * * * *